(12) United States Patent
Gillet et al.

(10) Patent No.: US 11,268,998 B1
(45) Date of Patent: Mar. 8, 2022

(54) DYNAMIC BRIDGE DIAGNOSTIC

(71) Applicant: Allegro MicroSystems, LLC, Manchester, NH (US)

(72) Inventors: Cedric Gillet, Annecy (FR); Andrea Foletto, Andorno Micca (IT); Christophe Lutz, Schwindratzheim (FR); Andreas P. Friedrich, Metz-Tessy (FR)

(73) Assignee: Allegro MicroSystems, LLC, Manchester, NH (US)

(*) Notice: Subject to any disclaimer, the term of this patent is extended or adjusted under 35 U.S.C. 154(b) by 0 days.

(21) Appl. No.: 17/130,219

(22) Filed: Dec. 22, 2020

(51) Int. Cl.
*G01R 27/08* (2006.01)
*G01R 27/26* (2006.01)
*G01R 1/44* (2006.01)
*G01K 7/20* (2006.01)

(52) U.S. Cl.
CPC ........... *G01R 27/2629* (2013.01); *G01R 1/44* (2013.01); *G01K 7/20* (2013.01)

(58) Field of Classification Search
CPC ...... G01R 1/44; G01R 1/203; G01R 19/0092; G01R 27/2629; G01R 31/50; G01R 31/52; G01R 31/54; G01R 31/55; G01R 31/56; G01R 31/58; G01R 31/66; G01R 31/69; G01R 31/2635; G01R 31/2642
See application file for complete search history.

(56) References Cited

U.S. PATENT DOCUMENTS

| 5,499,526 A | * | 3/1996 | Muro | G01L 1/18 73/1.38 |
| 5,631,602 A | * | 5/1997 | Kearney | G01L 1/225 330/146 |
| 6,422,088 B1 | * | 7/2002 | Oba | G01D 3/08 73/754 |
| 10,527,703 B2 | * | 1/2020 | Monreal | G01R 33/0035 |
| 2002/0033700 A1 | * | 3/2002 | Maher | G01R 17/10 324/526 |
| 2017/0350955 A1 | * | 12/2017 | Gentz | G01R 35/00 |

OTHER PUBLICATIONS

Allegro MicroSystems, LLC Datasheet "A17700, Pressure Sensor Interface and Signal Conditioning IC with Polynomial Signal Compensation and Advanced Diagnostics", Dec. 4, 2020, 31 pages.

* cited by examiner

*Primary Examiner* — Thang X Le
(74) *Attorney, Agent, or Firm* — Daly, Crowley, Mofford & Durkee, LLP

(57) ABSTRACT

An apparatus is provided, comprising: a plurality of terminals for coupling the apparatus to a sensing bridge; a switching circuitry that is coupled to at least one of the plurality of terminals; and a processing circuitry that is configured to: cause the switching circuitry to couple the plurality of terminals to a voltage source, a ground source, and the processing circuitry in accordance with a first connection profile; detect a failure of the sensing bridge or a connection between the sensing bridge and any of the plurality of terminals; select a second connection profile based on a type of the failure; and cause the switching circuitry to couple the plurality of terminals to the voltage source, the ground source, and the processing circuitry in accordance with the second connection profile.

24 Claims, 15 Drawing Sheets

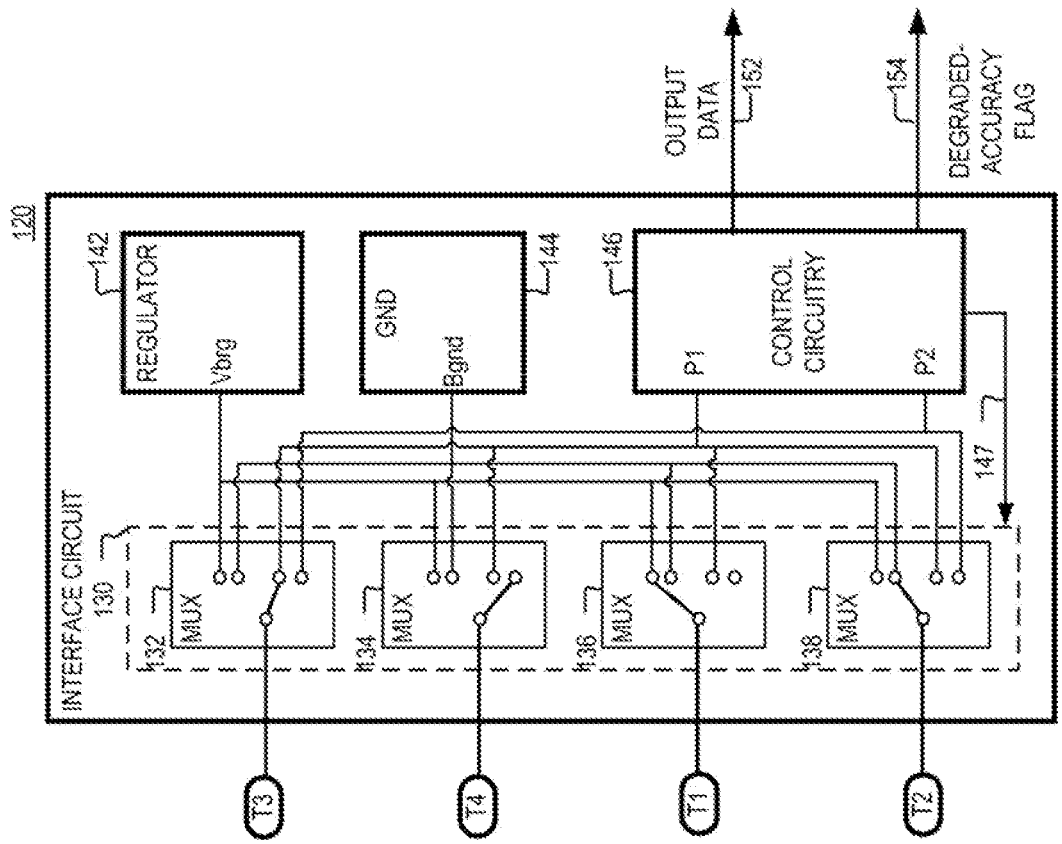
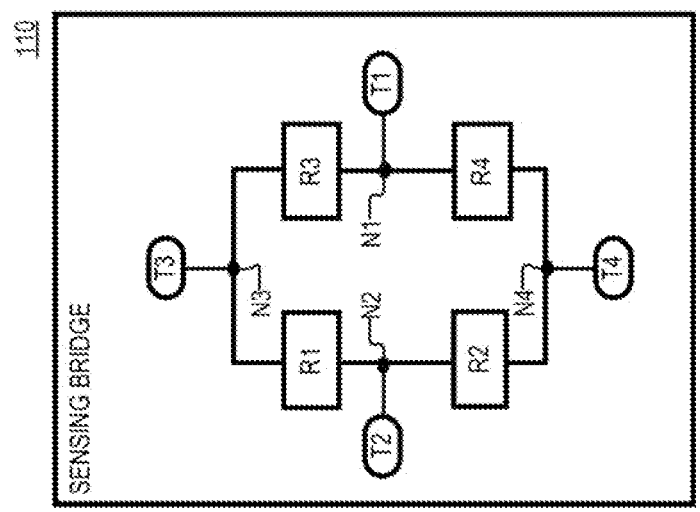
FIG. 1B
FIG. 1A

<REGULAR CONNECTION PROFILE CP_REG>

<FIRST CONNECTION PROFILE CP_1>

<SECOND CONNECTION PROFILE CP_2>

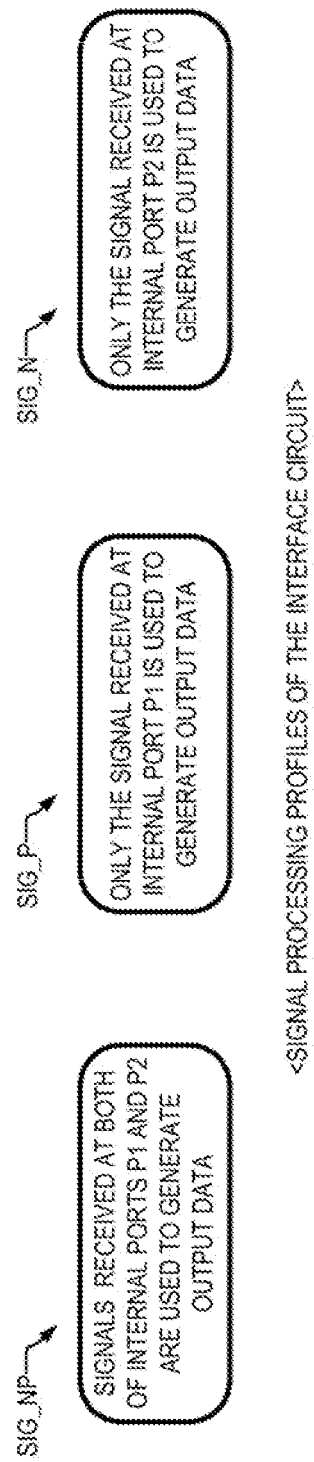

| Failure | T3 Voltage | T1 Voltage | T2 Voltage | T4 Voltage | Vcm | Bridge Current | Op. Mode of Sensing Bridge 110 |
|---|---|---|---|---|---|---|---|
| None | Vbrg | Vbrg/2 | Vbrg/2 | 0 | Vbrg/2 | =NC | CP_REG, SIG_NP |
| Open Vbrg | X | 0 | 0 | 0 | 0 | =0 | CP_1, SIG_P |
| Open Gnd | Vbrg | Vbrg | Vbrg | X | Vbrg | =0 | CP_2, SIG_P |
| Open R1 | Vbrg | Vbrg/2 | 0 | 0 | <Vbrg/2 | <NC | CP_REG, SIG_P |
| Open R2 | Vbrg | Vbrg/2 | Vbrg | 0 | >Vbrg/2 | <NC | CP_REG, SIG_P |
| Open R3 | Vbrg | 0 | Vbrg/2 | 0 | <Vbrg/2 | <NC | CP_REG, SIG_N |
| Open R4 | Vbrg | Vbrg | Vbrg/2 | 0 | >Vbrg/2 | <NC | CP_REG, SIG_N |
| Open Vp | Vbrg | X | Vbrg/2 | 0 | >Vbrg/2 | =NC | CP_REG, SIG_N |
| Open Vn | Vbrg | Vbrg/2 | X | 0 | >Vbrg/2 | =NC | CP_REG, SIG_P |
| Shorted R1 | Vbrg | Vbrg/2 | 0 | 0 | <Vbrg/2 | >NC | CP_REG, SIG_P |
| Shorted R2 | Vbrg | Vbrg/2 | Vbrg | 0 | >Vbrg/2 | >NC | CP_REG, SIG_P |
| Shorted R3 | Vbrg | Vbrg | Vbrg/2 | 0 | >Vbrg/2 | >NC | CP_REG, SIG_N |
| Shorted R4 | Vbrg | 0 | Vbrg/2 | 0 | <Vbrg/2 | >NC | CP_REG, SIG_N |

FIG. 1F

| Failure Mode | T3 Voltage | T1 Voltage | T2 Voltage | T4 Voltage | Vcm | Bridge Current | Op. Mode |
|---|---|---|---|---|---|---|---|
| None | Vbrg | Vbrg/2 | Vbrg/2 | 0 | Vbrg/2 | =NC | CP_REG, SIG_NP |
| Open Vbrg | X | 0 | 0 | 0 | 0 | =0 | CP_3, SIG_NP |
| Open Gnd | Vbrg | Vbrg | Vbrg | X | Vbrg | =0 | CP_4, SIG_NP |
| Open R1 | Vbrg | Vbrg/2 | 0 | 0 | < Vbrg/2 | <NC | CP_5, SIG_NP |
| Open R2 | Vbrg | Vbrg/2 | Vbrg | 0 | > Vbrg/2 | <NC | CP_6, SIG_NP |
| Open R3 | Vbrg | 0 | Vbrg/2 | 0 | < Vbrg/2 | <NC | CP_7, SIG_NP |
| Open R4 | Vbrg | Vbrg | Vbrg/2 | 0 | > Vbrg/2 | <NC | CP_8, SIG_NP |
| Open Vp | Vbrg | X | Vbrg/2 | 0 | > Vbrg/2 | =NC | CP_9, SIG_NP |
| Open Vn | Vbrg | Vbrg/2 | X | 0 | > Vbrg/2 | =NC | CP_10, SIG_NP |

FIG. 2L

DYNAMIC BRIDGE DIAGNOSTIC

BACKGROUND

Electronic sensors frequently use resistive transducers to form a sensing bridge circuit (hereinafter "a sensing bridge"). A sensing bridge may be coupled to an interface circuit, which receives signals generated by the sensing bridge and generates output data based on the signals. Depending on the physical parameter that is being measured with the sensing bridge, the output data may identify temperature, light intensity, color, magnetic field flux density, pressure, speed of a target, position of a target, current flow rate, and/or any other physical parameter that can be measured with resistive transducers. When any of the resistive transducers in a sensing bridge fails, or when any connection within the sensing bridge (such as a connection between the resistive transducer and the interface circuit fails), the output data that is generated by the interface circuit may become inaccurate or unavailable. The lack of accuracy or availability of the output data may cause equipment that uses the output data to fail. In safety-critical applications, such as autonomous driving, any such failure may pose danger to human life and property.

SUMMARY

According to aspects of the disclosure, an apparatus is provided, comprising: a plurality of terminals for coupling the apparatus to a sensing bridge, a switching circuitry that is coupled to at least one of the plurality of terminals, and a processing circuitry that is configured to: cause the switching circuitry to couple the plurality of terminals to a voltage source, a ground source, and the processing circuitry in accordance with a first connection profile, detect a failure of the sensing bridge or a connection between the sensing bridge and any of the plurality of terminals, select a second connection profile based on a type of the failure, and cause the switching circuitry to couple the plurality of terminals to the voltage source, the ground source, and the processing circuitry in accordance with the second connection profile.

According to aspects of the disclosure, an apparatus is provided, comprising: a plurality of terminals for coupling the apparatus to a sensing bridge, and a processing circuitry that is configured to: generate an output signal in accordance with a first signal processing profile, detect a failure in the sensing bridge or a connection between the sensing bridge and any of the plurality of terminals, select a second signal processing profile based on the type of the failure, and generate the output signal in accordance with the second signal processing profile, wherein generating the output signal in accordance with the first signal processing profile includes generating the output signal based on both a first signal that is generated by the sensing bridge and a second signal that is generated by the sensing bridge, and wherein generating the output signal in accordance with the second signal processing profile includes generating the output signal based on only one of the first signal and the second signal.

According to aspects of the disclosure, a method is provided for operating a sensing bridge, the method comprising: causing a switching circuitry to couple a plurality of terminals to a voltage source, a ground source, and a processing circuitry in accordance with a first connection profile, detecting a failure in the sensing bridge or a connection between the sensing bridge and any of the plurality of terminals, selecting a second connection profile based on a type of the failure, and causing the switching circuitry to couple the plurality of terminals to the voltage source, the ground source, and the processing circuitry in accordance with the second connection profile.

BRIEF DESCRIPTION OF THE DRAWINGS

The foregoing features may be more fully understood from the following description of the drawings in which:

FIG. 1A is a diagram of an example of a sensing bridge, according to aspects of the disclosure;

FIG. 1B is a diagram of an example of an interface circuit, according to aspects of the disclosure;

FIG. 1E is a diagram illustrating an example of signal processing profiles for an interface circuit, according to aspects of the disclosure;

FIG. 1F is a table illustrating aspects of the operation of the interface circuit of FIG. 1B, according to aspects of the disclosure;

FIG. 2L is a table illustrating aspects of the operation of the interface circuit of FIG. 1B, according to aspects of the disclosure.

DETAILED DESCRIPTION

Figure 1C:
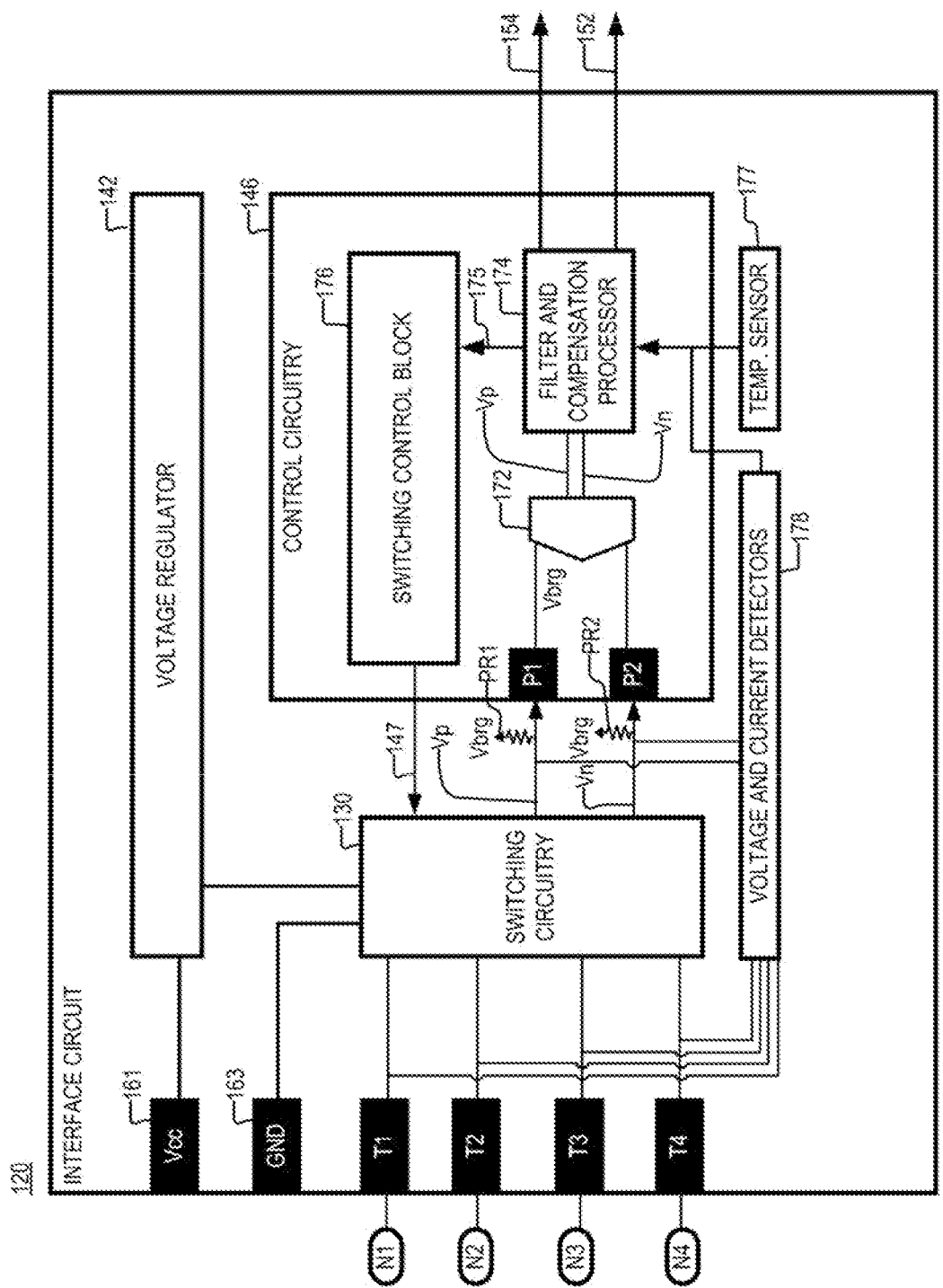
FIG. 1C is a diagram showing in further detail the interface circuit of FIG. 1B, according to aspects of the disclosure.

FIG. 1A is a diagram of an example of a sensing bridge 110, according to the aspects of the disclosure. According to the present example, the sensing bridge 110 is a Wheatstone bridge including a plurality of sensing elements R1-R4 and a plurality of nodes N1-N4. According to the example of FIG. 1, each of the sensing elements R1-R4 includes a strain gauge. However, alternative implementations are possible in which any of the sensing elements R1-R4 includes a different type of sensing element, such as a light-sensing element (e.g., a photodiode) or a magnetic field sensing element (e.g., a Hall plate, a Giant Magnetoresistive (GMR) element, a Tunnel Magnetoresistive (TMR) element, etc.). Although in the example of FIG. 1A, each of the blocks labeled R1-R4 represents a single sensing element, it will be understood that in some implementations each of the blocks R1-R4 may correspond multiple sensing elements. Although in the example of FIG. 1A, the sensing bridge 110 is a Wheatstone bridge, alternative implementations are possible in which the sensing bridge 110 is an H-bridge, and/or any other suitable type of sensing bridge. Stated succinctly, the present disclosure is not limited to any specific implementation of the sensing bridge 110.

FIG. 1B is a diagram of an interface circuit 120 that is configured to drive the sensing bridge 110. As illustrated, the interface circuit 120 may include a switching circuitry 130, a voltage regulator 142, a ground source 144, and a control circuitry 146.

The switching circuitry 130 may include multiplexers 132-138, and it may be configured to dynamically change the pinout of the interface circuit 120 in response to a control signal 147 that is provided to the switching circuitry 130 by the control circuitry 146. Multiplexer 132 may be configured to couple terminal T3 to any of (i) voltage regulator 142, (ii) ground source 144, (iii) internal port P1 of control circuitry 146, and (iv) internal port P2 of control circuitry 146. Multiplexer 134 may be configured to couple terminal T4 to any of (i) voltage regulator 142, (ii) ground source 144, (iii) internal port P1 of control circuitry 146, and (iv) internal port P2 of control circuitry 146. Multiplexer 136 may be configured to couple terminal T1 to any of (i) voltage regulator 142, (ii) ground source 144, (iii) internal port P1 of control circuitry 146, and (iv) internal port P2 of control circuitry 146. And multiplexer 138 may be configured to couple terminal T2 to any of (i) voltage regulator 142, (ii) ground source 144, (iii) internal port P1 of control circuitry 146, and (iv) internal port P2 of control circuitry 146.

Together, multiplexers 132-138 may be configured to couple any one of terminals T1-T4 to the voltage regulator 142. In other words, the multiplexers 132-138 may enable the interface circuit 120 to apply a voltage signal Vbrg that is provided by the voltage regulator 142 at any one of the nodes N1-N4 of the sensing bridge 110. Together, multiplexers 132-138 may be configured to couple any one of the terminals T1-T4 to the ground source 144. In other words, the multiplexers 132-138 may enable the interface circuit 120 to apply a ground signal Vgnd that is provided by the ground source 144 at any one of the nodes N1-N4 of the interface circuit 120. Together, multiplexers 132-138 may be configured to couple any one of the terminals T1-T4 to the internal port P1 of the control circuitry 146. In other words, the multiplexers 132-138 may enable the internal port P1 to be coupled to any one of the nodes N1-N4 of the sensing bridge 110. Together, multiplexers 132-138 may be configured to couple any one of the terminals T1-T4 to the internal port P2 of the control circuitry 146. In other words, the multiplexers 132-138 may enable the internal port P2 to be coupled to any one of the nodes N1-N4 of the sensing bridge 110.

The voltage regulator 142 may include any suitable type of electronic circuit or element that is configured to provide the voltage signal Vbrg to the sensing bridge 110. The ground source 144 may include a ground terminal that is provided on the packaging of the interface circuit (e.g., see terminal 163, which is shown in FIG. 1C). The ground source 144 may be configured to provide a ground signal Bgnd to the sensing bridge 110. The ground signal Bgnd may be equal to 0V, −Vbrg, and/or any other suitable type of reference voltage value. Although in the example of FIG. 1B, the ground source 144 includes a ground terminal, alternative implementations are possible in which ground source 144 includes any suitable type of circuitry that is configured to provide a reference voltage to the sensing bridge 110.

The control circuitry 146 may include any suitable type of processing circuitry that is arranged to receive at least one of signals Vp and Vn from the sensing bridge 110 and generate output data 152 based on one or both of the received signal(s). The signals Vp and Vn may be generated by the sensing bridge 110, and, in one particular example, they may indicate pressure that is being applied on the sensing bridge 110. Similarly, the output data 152 may also indicate the pressure that is being applied on sensing bridge 110. As is discussed further below, the output data may be generated by performing temperature compensation (and/or other types of compensation) on the signals Vp and Vn. The output data 152 may be provided for further processing to an Electronic Control Unit (ECU) and/or any other electronic device that is operatively coupled to the interface circuit 120.

The control circuitry 146 may also generate a degraded-accuracy flag 154. When the output data 152 is generated based on both the signal Vp and Vn, the degraded accuracy flag may be set by the control circuitry 146 to a first value (e.g., '0'). When the signal output data 152 is generated based on only one of the signals Vp and Vn, the degraded-accuracy flag 154 may be set to a second value (e.g., '1'). When the degraded-accuracy flag 154 is set to the second value, this may indicate that the output data 152 represents pressure (or another physical quantity that is measured by the sensing bridge 110) less accurately than when the degraded-accuracy flag 154 is set to the first value (e.g., '0'). The degraded accuracy flag 154 may be supplied to the same ECU or another device that receives the output data 152, and it may be used by the ECU (or another device) for the purposes of processing the output data 152.

The control circuitry 146 may be configured to provide the switching circuitry 130 with a control signal 147. The control signal 147 may specify the state of each of the multiplexers 132-138. More particularly, the value of the control signal 147 may specify the current pinout of the interface circuit 120. In this regard, it will be understood that the control circuitry 146 may generate the control signal 147, such that, at any given time: (i) only one of the terminals T1-T4 is coupled to the voltage regulator 142; only one of the terminals T1-T4 is coupled to the ground source 144; only one of the terminals T1-T4 is coupled to the internal port P1 of the control circuitry 146; and only one of the terminals T1-T4 is coupled to the internal port P2 of the control circuitry 146. In other words, the control circuitry 146 may be configured to operate the switching circuitry 130 in such manner that each of the voltage regulator 142, the ground source 144, the internal port P1, and the internal port P2 is coupled to only one of the terminals T1-T4 at any given time of the operation of the interface circuit 120.

FIG. 1C is a schematic diagram of the interface circuit 120 showing the control circuitry 146 in further detail. As illustrated, the interface circuit 120 may also include a power supply terminal 161 and a ground terminal 163. Furthermore, the control circuitry 146 may include an analog-to-digital converter (ADC) 172, a filter and compensation processor 174, and a switching control block 176.

The ADC 172 may include any suitable type of analog-to-digital converter. The ADC 172 may receive signals Vp and Vn from the sensing bridge 110, digitize the received signals Vp and Vn, and provide the digitized signals Vp and Vn to the filter and compensation processor 174.

The filter and compensation processor 174 may include any suitable type of processing circuitry, such as a general-purpose processor, a special-purpose processor, an application-specific integrated circuit (ASIC), a Field-Programmable Gate Array (FPGA), etc. The filter and compensation processor 174 may be configured to receive the digitized signals Vp and Vn, and apply one or more digital filters to the digitized signals Vp and/or Vn. Furthermore, the filter and compensation processor 174 may generate the output data 152 based on the signals Vp and Vn. As is discussed further below, the output data 152 may be generated based on one or both of the signals Vp and Vn.

The filter and compensation processor 174 may generate the output data 152 by performing gain and offset adjustment on the signals Vp and Vn (e.g., on one of the signals Vp and Vn or on their difference). The gain and/or offset adjustment may be performed based on a signal that is received from a temperature sensor 177. Although in the example of FIG. 1C the compensation block performs temperature compensation, it will be understood that the present disclosure is not limited to any specific type of compensation being performed by the filter and compensation processor 174.

The filter and compensation processor 174 may be configured to generate a signal 175 and provide the signal 175 to the switching control block 176. The signal 175 may specify a desired connection profile. The desired connection profile may be the same or similar to any of the connection profiles that are discussed further below with respect to FIGS. 1D and 1F. The desired connection profile may be selected by the filter and compensation processor 174 in accordance with a process 300, which is discussed further below with respect to FIG. 3.

The switching control block 176 may include any suitable type of electronic circuitry for controlling the state of the switching circuitry 130. In operation, the switching control block 176 may receive the signal 175 from the filter and compensation processor. Based on the signal 175, the switching control block may set the control signal 147 to a value, which causes the switching circuitry 130 to connect the sensing bridge 110 to the interface circuit in accordance with the connection profile that is specified by the signal 175.

The filter and compensation processor 174 and the switching control block 176 are provided as an example only. Although in the example of FIG. 1C, the filter and compensation processor 174 and the switching control block 176 are depicted as discrete components, it will be understood that, in some implementations, they may be partially or fully integrated with one another. Those of ordinary skill in the art will readily appreciate that there are various ways to generate output data based on signals that are generated by a sensing bridge. Furthermore, those of ordinary skilled in the art will readily appreciate that there are various ways to perform gain and offset adjustment on signal(s) that are generated by a sensing bridge. In this regard, it will be understood that the present disclosure is not limited to any specific implementation of the filter and compensation processor 174 and/or the control circuitry 146.

According to the example of FIG. 1C, the processing circuitry 146 may be coupled to a voltage and current detector 178. The voltage and current detector 178 may include any suitable type of circuitry that is configured to detect one or more of, the voltage at any of terminal T1, T2, T3, and T4 (and/or nodes N1, N2, N3, N4 of the sensing bridge 110) and provide an indication of the detected voltage to the control circuitry 146. Additionally or alternatively, in some implementations the voltage and current detector 178 may be configured to measure the voltage at any of the internal ports P1 and P2 and provide an indication of the measured voltage to the control circuitry 146. Additionally or alternatively, in some implementations, the voltage the and current detector 178 may be configured to detect the current across the sensing bridge 110 (e.g., by measuring the current between any two of the terminals T1, T2, T3, and T4) and provide an indication of the measured current to the control circuitry 146.

Figure 1D:
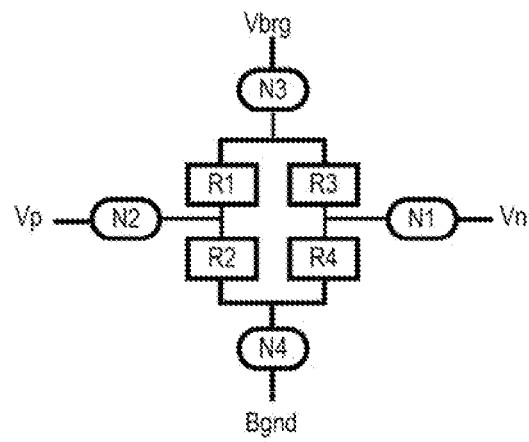
FIG. 1D is a diagram illustrating an example of connection profiles for an interface circuit, according to aspects of the disclosure.
Figure 1D:
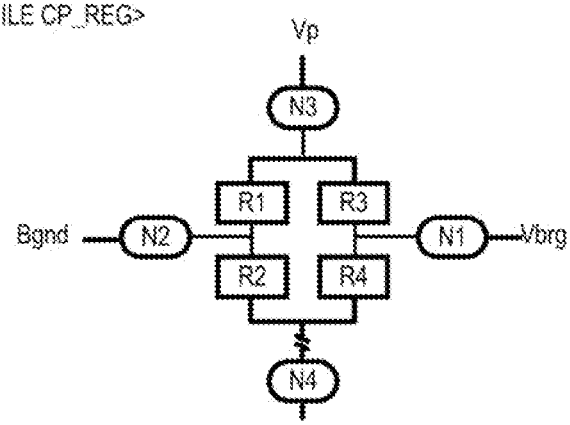
Figure 1D:
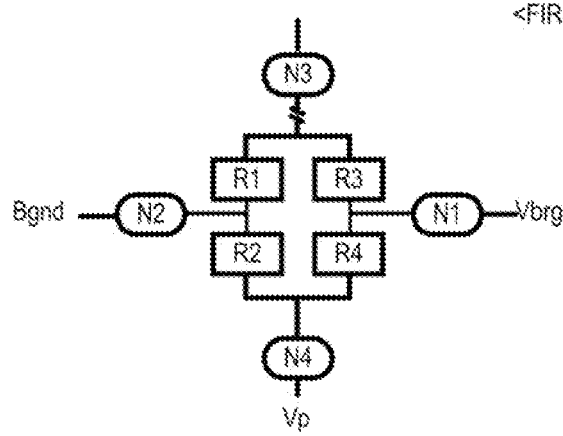

FIG. 1D illustrates a plurality of connection profiles for coupling the sensing bridge 110 to the interface circuit 120. More particularly, shown in FIG. 1D is a regular connection profile CP_REG, a first connection profile CP_1, and a second connection profile CP_2.

The sensing bridge 110 may be coupled to the interface circuit 120 in accordance with the regular connection profile CP_REG, when no failures are present in the sensing bridge 110 and/or any connections between the sensing bridge 110 and the interface circuit 120. Furthermore, the sensing bridge 110 may be coupled to the interface circuit 120 in accordance with the regular connection profile CP_REG when the connection between the interface circuit 120 and one of the nodes N1 and N2 has become open, but the sensing bridge 110 remains able to receive the voltage signal Vbrg and the ground signal Bgnd at nodes N3 and N4, respectively. When the sensing bridge 110 is coupled to the interface circuit 120 in accordance with the regular connection profile CP_REG, the voltage signal Vbrg may be applied at node N3 of the sensing bridge 110 and the ground signal Bgnd may be applied at node N4 of the sensing bridge 110. Furthermore, when the sensing bridge 110 is coupled to the interface circuit 120 in accordance with the regular connection profile CP_REG, the internal port P1 of the control circuitry 146 may be coupled to node N1 of the sensing bridge 110, and/or the internal port P2 of the control circuitry 146 may be coupled to node N2 of the sensing bridge.

The sensing bridge 110 may be coupled to the interface circuit 120 in accordance with the first connection profile CP_1 when a connection between node N4 of the sensing bridge 110 and the interface circuit 120 is open (e.g., due to mechanical or electrical damage), and the sensing bridge 110 can no longer receive the ground signal Bgnd at node N4. When the sensing bridge 110 is coupled to the interface circuit 120 in accordance with the first connection profile CP_1, the voltage signal Vbrg may be applied at node N1 of the sensing bridge 110, the ground signal Bgnd may be applied at node N2 of the sensing bridge 110, and node N3 of the sensing bridge 110 may be coupled to internal port P1 of the control circuitry 146. Furthermore, when the sensing bridge 110 is coupled to the interface circuit 120 in accordance with the first connection profile CP_1, node N4 of the sensing bridge may be disconnected from the interface circuit 120 (and/or the control circuitry 146).

The sensing bridge 110 may be coupled to the interface circuit 120 in accordance with the second connection profile CP_2 when a connection between node N3 of the sensing bridge 110 and the interface circuit 120 is open (e.g., due to mechanical or electrical damage), and the sensing bridge 110 can no longer receive the voltage signal Vbrg at node N3. When the sensing bridge 110 is coupled to the interface circuit 120 in accordance with the second connection profile CP_2, the voltage signal Vbrg may be applied at node N1 of the sensing bridge 110, the ground signal Bgnd may be applied at node N2 of the sensing bridge 110, and node N4 of the sensing bridge 110 may be coupled to internal port P1 of the control circuitry 146. Furthermore, when the sensing bridge 110 is coupled to the interface circuit 120 in accordance with the second connection profile CP_2, node N3 of the sensing bridge may be disconnected from the interface circuit 120 (and/or the control circuitry 146).

FIG. 1E illustrates a plurality of signal processing profiles of the interface circuit 120. More particularly, shown in FIG. 1E is a signal processing profile SIG_NP, a signal processing profile SIG_P, and a signal processing profile SIG_N.

When the interface circuit 120 operates in accordance with the signal processing profile SIG_NP, the output data 152 is generated based on signals that are received at both of internal ports P1 and P2. Put differently, when the interface circuit 120 operates in accordance with the signal processing profile SIG_NP, both signals Vp and Vn, which are produced by the sensing bridge 110, are used to generate the output data 152. As can be readily appreciated, when the interface circuit 120 operates in accordance with the first signal processing profile SIG_NP, the sensing bridge 110 is used as a full bridge.

When the interface circuit 120 operates in accordance with the signal processing profile SIG_P, the output data 152 is generated based on a signal that is received at only one of internal ports P1 and P2. More specifically, when the interface circuit 120 operates in accordance with the signal processing profile SIG_P, only signal Vp (but not signal Vn) is used to generate the output data 152. As can be readily appreciated, when the interface circuit 120 operates in accordance with the signal processing profile SIG_P, the sensing bridge 110 is used as a half-bridge.

When the interface circuit 120 operates in accordance with the signal processing profile SIG_N, the output data 152 is generated based on a signal that is received at only one of internal ports P1 and P2. More specifically, when the interface circuit 120 operates in accordance with the signal processing profile SIG_N, only signal Vn (but not signal Vp) is used to generate the output data 152. As can be readily appreciated when the interface circuit 120 operates in accordance with the signal processing profile SIG_N, the sensing bridge 110 is used as a half-bridge.

FIG. 1F depicts an example of a truth table 180, which describes the operation of the interface circuit 120 in further detail. More particularly, in operation, the control circuitry 146 (which is part of the interface circuit 120) may detect when there is a failure in the sensing bridge 110 and/or a connection between the sensing bridge 110 and the interface circuit 120. When such failure is detected, the control circuitry 146 may cause the switching circuitry 130 to change the connection profile of the sensing bridge 110. Furthermore, when such failure is detected, the control circuitry 146 may also change the signal processing profile that is used by the interface circuit 120 to generate the output data 152. In other words, the control circuitry 146 may respond to certain failures in the sensing bridge 110 and/or a connection between the sensing bridge 110 and the interface circuit 120 by changing the connection profile of the sensing bridge 110 and/or by changing the signal processing profile that is used to generate the output data 152. Doing so may allow the sensing bridge 110 and the interface circuit 120 to remain operational, despite the failures.

In some implementations, to detect whether a failure is present in the sensing bridge 110 or a connection between the sensing bridge 110 and the interface circuit, the control circuitry 146 may monitor one or more of: (1) the voltage at terminal T1 of the sensing bridge 110, (2) the voltage at terminal T2 of the sensing bridge 110, (3) the voltage at terminal T3 of the sensing bridge 110, (4) the voltage at terminal T4 of the sensing bridge 110, (4) the common-mode voltage Vcm of the sensing bridge 110, and (5) the current across the sensing bridge 110. The current across the sensing bridge 110 may be detected by monitoring the current between any two terminals of the interface circuit 120 that are used for suppling the voltage signal Vbrg and ground signal Bgnd to the sensing bridge 110. In some implementations, the common-mode voltage Vcm of the sensing bridge 110 may be equal to the half-sum of the voltages at internal ports P1 and P2, and it can be defined in accordance with Equation 1 below (assuming bridge resistance value very similar):

$$Vcm = \frac{1}{2}(Vp1 + Vp2) \quad (1)$$

where Vcm is the common-mode voltage of the sensing bridge 110, Vp1 is the voltage at internal port P1 of the interface circuit 120, and Vp2 is the voltage at internal port P2. When the sensing bridge 110 and the interface circuit 120 are operating correctly, the value of Vp1 may be equal to the level of signal Vp, which is generated by the sensing bridge 110. When the sensing bridge 110 and the interface circuit 120 are operating correctly, the value of Vp2 may be equal to the level of signal Vn, which is generated by the sensing bridge 110.

Additionally or alternatively, in some implementations, the common mode voltage Vcm of the sensing bridge 110 may be calculated by determining either one of Vp1 or Vp2. As can be readily appreciated, when the equivalent resistances R1, R2, R3, and R4 (shown in FIG. 1A) are the same, the common mode voltage Vcm may be equal to either one of the Vp1 and Vp2. During normal operation of the bridge 110, the values of Vp1 and Vp2 may be determined in accordance with equations 2 and 3 below:

$$Vp1 = Vbrg * \left(\frac{R2}{R1 + R2}\right) \quad (2)$$

$$Vp2 = brg * \left(\frac{R4}{R3 + R4}\right) \quad (3)$$

When the interface circuit 120 loses reception of (i.e. connection to) the voltage signal Vp (e.g., due to a failure of the sensing bridge 110 or a failure of a connection between the sensing bridge and the port P1), the voltage at internal port P1 may be pulled up by pull-up resistor PR1 (shown in FIG. 1A) to a value that is outside of the normal range for the signal Vp (i.e., Vbrg in the present example). As is discussed further below, deviations of the voltage at internal port P1 from the normal range for the signal Vp may be used to detect failures in the sensing bridge 110 or a connection between the sensing bridge 110 and the interface circuit 120. Similarly, when the interface circuit 120 loses reception of the voltage signal Vn (e.g., due to a failure of the sensing bridge 110 or a failure of a connection between the sensing bridge and the port P2), the voltage at internal port P2 may be pulled up by pull-up resistor PR2 to a value that is outside of the normal range for the signal Vn (i.e., Vbrg in the present example). As is discussed further below, deviations of the voltage at internal port P2 from the normal range for the signal Vn may be used to detect failures in the sensing bridge 110 or a connection between the sensing bridge 110 and the interface circuit 120. Although in the example of FIG. 1A, resistors PR1 and PR2 are pull-up resistors, alternative implementations are possible in which any of resistors PR1 and PR2 is a pull down resistor. As illustrated, table 180 includes columns 171A-H. Column 171A identifies a plurality of failures that may be experienced by the sensing bridge 110 and/or interface circuit 120. Column 171B identifies the voltage at terminal T3 of the sensing bridge when the sensing bridge 110 is coupled to the interface circuit 120 in accordance with the regular connection profile CP_REG and one of the failures identified in column 171A occurs. Column 171C identifies the voltage at terminal T1 of the sensing bridge 110 when the sensing bridge 110 is coupled to the interface circuit 120 in accordance with the regular connection profile CP_REG and one of the failures identified in column 171A occurs. Column 171D identifies the voltage at terminal T2 of the sensing bridge 110 when the sensing bridge 110 is coupled to the interface circuit 120 in accordance with the regular connection profile CP_REG and one of the failures identified in column 171A occurs. Column 171E identifies the voltage at terminal T4 of the sensing bridge 110 when the sensing bridge 110 is coupled to the interface circuit 120 in accordance with the regular connection profile CP_REG and one of the failures identified in column 171A occurs. Column 171F identifies the common voltage of the sensing bridge 110 when the sensing bridge 110 is coupled to the interface circuit 120 in accordance with the regular connection profile CP_REG and one of the failures identified in column 171A occurs. Column 171G identifies the current across the sensing bridge 110 when the sensing bridge 110 is coupled to the interface circuit 120 in accordance with the regular connection profile CP_REG and one of the failures identified in column 171A occurs. Column 171H identifies the connection profile, which the sensing bridge 110 is transitioned to when any of the failures identified in column 171A is detected by the control circuitry 146. Column 171H further identifies the signal processing profile, which the interface circuit 120 is transitioned to when any of the failures identified in column 171A is detected by the control circuitry 146.

Table 180 describes the value of the voltage at any of terminals T1-T4, and the common-mode voltage Vcm in terms of a threshold value Vbrg. According to the present example, Vbrg is the level of the voltage signal Vbrg when the sensing bridge 110 and the interface circuit 120 are operating correctly. Furthermore, table 180 describes the current across the sensing bridge 110 in terms of a value NC. According to the present example, NC is the level of current across the sensing bridge 110 when the sensing bridge 110 and the interface circuit 120 are operating correctly.

Row 173A identifies the state of the interface circuit 120 (and/or sensing bridge 110) when the sensing bridge 110 and the interface circuit 120 are operating correctly. Specifically, row 173A indicates that when no failures are present in the sensing bridge 110 or a connection between the sensing bridge 110 and the interface circuit 120: (i) the voltage at terminal T3 would be equal to Vbrg; (ii) the voltage at terminal T1 would be substantially equal to Vbrg/2; (iii) the voltage at terminal T2 would be substantially equal to Vbrg/2; (iv) the voltage at terminal T4 would be equal to 0; (v) the common-mode voltage Vcm of the sensing bridge 110 would be substantially equal to Vbrg/2; (vi) the current across the sensing bridge 110 would be equal to NC. Furthermore, row 173A indicates that when the sensing bridge 110 and the interface circuit 120 are operating correctly, the sensing bridge 110 may be connected to the interface circuit 120 in accordance with the regular connection profile CP_REG, and the signal processing profile of the interface circuit 120 may be SIG_NP. According to the present example, the voltage at a terminal is substantially equal to Vbrg/2 if the voltage at the terminal is within 15% of Vbrg/2.

Row 173B identifies the state of the interface circuit 120 (and/or sensing bridge 110) when the sensing bridge 110 loses reception of the voltage signal Vbrg from the interface circuit 120. Specifically, row 173B indicates that when the sensing bridge 110 no longer receives the voltage signal Vbrg from the interface circuit 120: (i) the voltage at terminal T3 would be floating; (ii) the voltage at terminal T1 would be equal to 0; (iii) the voltage at terminal T2 would be equal to 0; (iv) the voltage at terminal T4 would be equal to 0; (v) the common-mode voltage Vcm of the sensing bridge 110 would be equal to 0; and (vi) the current across the sensing bridge 110 would be equal to 0. Row 173B also indicates that when the sensing bridge 110 loses reception of the voltage signal Vbrg, the control circuitry 146 may transition the sensing bridge 110 from the regular connection profile CP_REG to the first connection profile CP_1. Row 173B further indicates that when the sensing bridge 110 loses reception of the voltage signal Vbrg, the control circuitry 146 may transition the interface circuit 120 from signal processing profile SIG_NP to signal processing profile SIG_P.

Row 173C identifies the state of the interface circuit 120 (and/or sensing bridge 110) when the sensing bridge 110 loses reception of the ground signal Bgnd from the interface circuit 120. Specifically, row 173C indicates that when the sensing bridge 110 no longer receives the ground signal Vgnd from the interface circuit 120: (i) the voltage at terminal T3 would be equal to Vbrg; (ii) the voltage at terminal T1 would be equal to Vbrg; (iii) the voltage at terminal T2 would be equal to Vbrg; (iv) the voltage at terminal T4 would be floating; (v) the common-mode voltage Vcm of the sensing bridge 110 would be equal to Vbrg; and (vi) the current across the sensing bridge 110 would be equal to 0. Row 173C also indicates that when the sensing bridge 110 loses reception of the ground signal Vgnd, the control circuitry 146 may transition the sensing bridge 110 from the regular connection profile CP_REG to the second connection profile CP_2. Row 173C further indicates that when the sensing bridge 110 loses reception of the ground signal Vgnd, the control circuitry 146 may transition the interface circuit 120 from signal processing profile SIG_NP to signal processing profile SIG_P.

Row 173D identifies the state of the interface circuit 120 (and/or sensing bridge 110) when the sensing element R1 is open. Specifically, row 173D indicates that when the sensing element R1 is open: (i) the voltage at terminal T3 would be equal to Vbrg; (ii) the voltage at terminal T1 would be equal to Vbrg/2; (iii) the voltage at terminal T2 would be equal to 0; (iv) the voltage at terminal T4 would be equal to 0; (v) the common-mode voltage Vcm of the sensing bridge 110 would be substantially less than Vbrg/2; and (vi) the current across the sensing bridge 110 would be substantially less than NC. Row 173D also indicates that when the sensing element R1 becomes open, the control circuitry 146 may leave unchanged the connection profile of the sensing bridge 110. Row 173D further indicates that when the sensing element R1 becomes open, the control circuitry 146 may transition the interface circuit 120 from signal processing profile SIG_NP to signal processing profile SIG_P.

Row 173E identifies the state of the interface circuit 120 (and/or sensing bridge 110) when the sensing element R2 is open. Specifically, row 173E indicates that when the sensing element R2 is open: (i) the voltage at terminal T3 would be equal to Vbrg; (ii) the voltage at terminal T1 would be equal to Vbrg/2; (iii) the voltage at terminal T2 would be equal to Vbrg; (iv) the voltage at terminal T4 would be equal to 0; (v) the common-mode voltage Vcm of the sensing bridge 110 would be substantially greater than Vbrg/2; and (vi) the current across the sensing bridge 110 would be substantially less than NC. Row 173E also indicates that when the sensing element R2 becomes open, the control circuitry 146 may leave unchanged the connection profile of the sensing bridge 110. Row 173E further indicates that when the sensing element R2 becomes open, the control circuitry 146 may transition the interface circuit 120 from signal processing profile SIG_NP to signal processing profile SIG_P.

Row 173F identifies the state of the interface circuit 120 (and/or sensing bridge 110) when the sensing element R3 is open. Specifically, row 173F indicates that when the sensing element R3 is open: (i) the voltage at terminal T3 would be equal to Vbrg; (ii) the voltage at terminal T1 would be equal to 0; (iii) the voltage at terminal T2 would be equal to Vbrg/2; (iv) the voltage at terminal T4 would be equal to 0; (v) the common-mode voltage Vcm of the sensing bridge 110 would be substantially less than Vbrg/2; and (vi) the current across the sensing bridge 110 would be substantially less than NC. Row 173F also indicates that when the sensing element R3 becomes open, the control circuitry 146 may leave unchanged the connection profile of the sensing bridge 110. Row 173F further indicates that when the sensing element R3 becomes open, the control circuitry 146 may transition the interface circuit 120 from signal processing profile SIG_NP to signal processing profile SIG_N.

Row 173G identifies the state of the interface circuit 120 (and/or sensing bridge 110) when the sensing element R4 is open. Specifically, row 173G indicates that when the sensing element R4 is open: (i) the voltage at terminal T3 would be equal to Vbrg; (ii) the voltage at terminal T1 would be equal to Vbrg; (iii) the voltage at terminal T2 would be equal to Vbrg/2; (iv) the voltage at terminal T4 would be equal to 0; (v) the common-mode voltage Vcm of the sensing bridge 110 would be substantially greater than Vbrg/2; and (vi) the current across the sensing bridge 110 would be substantially less than NC. Row 173G also indicates that when the sensing element R4 becomes open, the control circuitry 146 may leave unchanged the connection profile of the sensing bridge 110. Row 173G further indicates that when the sensing element R4 becomes open, the control circuitry 146 may transition the interface circuit 120 from signal processing profile SIG_NP to signal processing profile SIG_N.

Row 173H identifies the state of the interface circuit 120 (and/or sensing bridge 110) when the interface circuit 120 loses reception of the signal Vp at the internal port P1. Specifically, row 173H indicates that when the connection between the internal port P1 and the sensing bridge 110 becomes open: (i) the voltage at terminal T3 would be equal to Vbrg; (ii) the voltage at terminal T1 would be floating; (iii) the voltage at terminal T2 would be equal to Vbrg/2; (iv) the voltage at terminal T4 would be equal to 0; (v) the common-mode voltage Vcm of the sensing bridge 110 would be substantially greater than Vbrg/2; and (vi) the current across the sensing bridge 110 would be substantially equal to NC. Row 173H also indicates that when the connection between the internal port P1 and the sensing bridge 110 becomes open, the control circuitry 146 may leave unchanged the connection profile of the sensing bridge 110. Row 173H further indicates that when the connection between the internal port P1 and the sensing bridge 110 becomes open, the control circuitry 146 may transition the interface circuit 120 from signal processing profile SIG_NP to signal processing profile SIG_N.

Row 173I identifies the state of the interface circuit 120 (and/or sensing bridge 110) when the interface circuit 120 loses reception of the signal Vn at the internal port P2. Specifically, row 173I indicates that when the connection between the internal port P2 and the sensing bridge 110 becomes open: (i) the voltage at terminal T3 would be equal to Vbrg; (ii) the voltage at terminal T1 would be equal to Vbrg/2; (iii) the voltage at terminal T2 would be floating; (iv) the voltage at terminal T4 would be equal to 0; (v) the common-mode voltage Vcm of the sensing bridge 110 would be substantially greater than Vbrg/2; and (vi) the current across the sensing bridge 110 would be substantially equal to NC. Row 173I also indicates that when the connection between the internal port P2 and the sensing bridge 110 becomes open, the control circuitry 146 may leave unchanged the connection profile of the sensing bridge 110. Row 173I further indicates that when the connection between the internal port P3 and the sensing bridge 110 becomes open, the control circuitry 146 may transition the interface circuit 120 from signal processing profile SIG_NP to signal processing profile SIG_P.

Row 173J identifies the state of the interface circuit 120 (and/or sensing bridge 110) when the sensing element R1 is shorted. Specifically, row 173J indicates that when the sensing element R1 becomes shorted: (i) the voltage at terminal T3 would be equal to Vbrg; (ii) the voltage at terminal T1 would be equal to Vbrg/2; (iii) the voltage at terminal T2 would be equal to Vbrg; (iv) the voltage at terminal T4 would be equal to 0; (v) the common-mode voltage Vcm of the sensing bridge 110 would be substantially greater than Vbrg/2; and (vi) the current across the sensing bridge 110 would be substantially greater than NC. Row 173J also indicates that when the sensing element R1 becomes shorted, the control circuitry 146 may leave unchanged the connection profile of the sensing bridge 110. Row 173J further indicates that when the sensing element R1 becomes shorted, the control circuitry 146 may transition the interface circuit 120 from signal processing profile SIG_NP to signal processing profile SIG_P.

Row 173K identifies the state of the interface circuit 120 (and/or sensing bridge 110) when the sensing element R2 is shorted. Specifically, row 173K indicates that when the sensing element R2 becomes shorted: (i) the voltage at terminal T3 would be equal to Vbrg; (ii) the voltage at terminal T1 would be equal to Vbrg/2; (iii) the voltage at terminal T2 would be equal to 0; (iv) the voltage at terminal T4 would be equal to 0; (v) the common-mode voltage Vcm of the sensing bridge 110 would be substantially less than Vbrg/2; and (vi) the current across the sensing bridge 110 would be substantially greater than NC. Row 173K also indicates that when the sensing element R2 becomes shorted, the control circuitry 146 may leave unchanged the connection profile of the sensing bridge 110. Row 173K further indicates that when the sensing element R2 becomes shorted, the control circuitry 146 may transition the interface circuit 120 from signal processing profile SIG_NP to signal processing profile SIG_P.

Row 173L identifies the state of the interface circuit 120 (and/or sensing bridge 110) when the sensing element R3 is shorted. Specifically, row 173L indicates that when the sensing element R3 is shorted: (i) the voltage at terminal T3 would be equal to Vbrg; (ii) the voltage at terminal T1 would be equal to Vbrg; (iii) the voltage at terminal T2 would be equal to Vbrg/2; (iv) the voltage at terminal T4 would be equal to 0; (v) the common-mode voltage Vcm of the sensing bridge 110 would be substantially greater than Vbrg/2; and (vi) the current across the sensing bridge 110 would be substantially greater than NC. Row 173L also indicates that when the sensing element R3 becomes shorted, the control circuitry 146 may leave unchanged the connection profile of the sensing bridge 110. Row 173L further indicates that when the sensing element R3 becomes shorted, the control circuitry 146 may transition the interface circuit 120 from signal processing profile SIG_NP to signal processing profile SIG_N.

Row 173M identifies the state of the interface circuit 120 (and/or sensing bridge 110) when the sensing element R4 is shorted. Specifically, row 173M indicates that when the sensing element R4 is shorted: (i) the voltage at terminal T3 would be equal to Vbrg; (ii) the voltage at terminal T1 would be equal to 0; (iii) the voltage at terminal T2 would be equal to Vbrg/2; (iv) the voltage at terminal T4 would be equal to 0; (v) the common-mode voltage Vcm of the sensing bridge 110 would be substantially less than Vbrg/2; and (vi) the current across the sensing bridge 110 would be substantially greater than NC. Row 173M also indicates that when the sensing element R4 becomes shorted, the control circuitry 146 may leave unchanged the connection profile of the sensing bridge 110. Row 173M further indicates that when the sensing element R4 becomes shorted, the control circuitry 146 may transition the interface circuit 120 from signal processing profile SIG_NP to signal processing profile SIG_N.

As used throughout the disclosure, the phrase "substantially greater" shall be interpreted as "greater than by a predetermined amount." As used throughout the disclosure, the phrase "substantially less" shall be interpreted as "less than by a predetermined amount (e.g., less by 25% or more)." As used throughout the disclosure, the phrase "equal to" shall be interpreted as "exactly the same as" or "within a predetermined amount from."

Figure 2A:
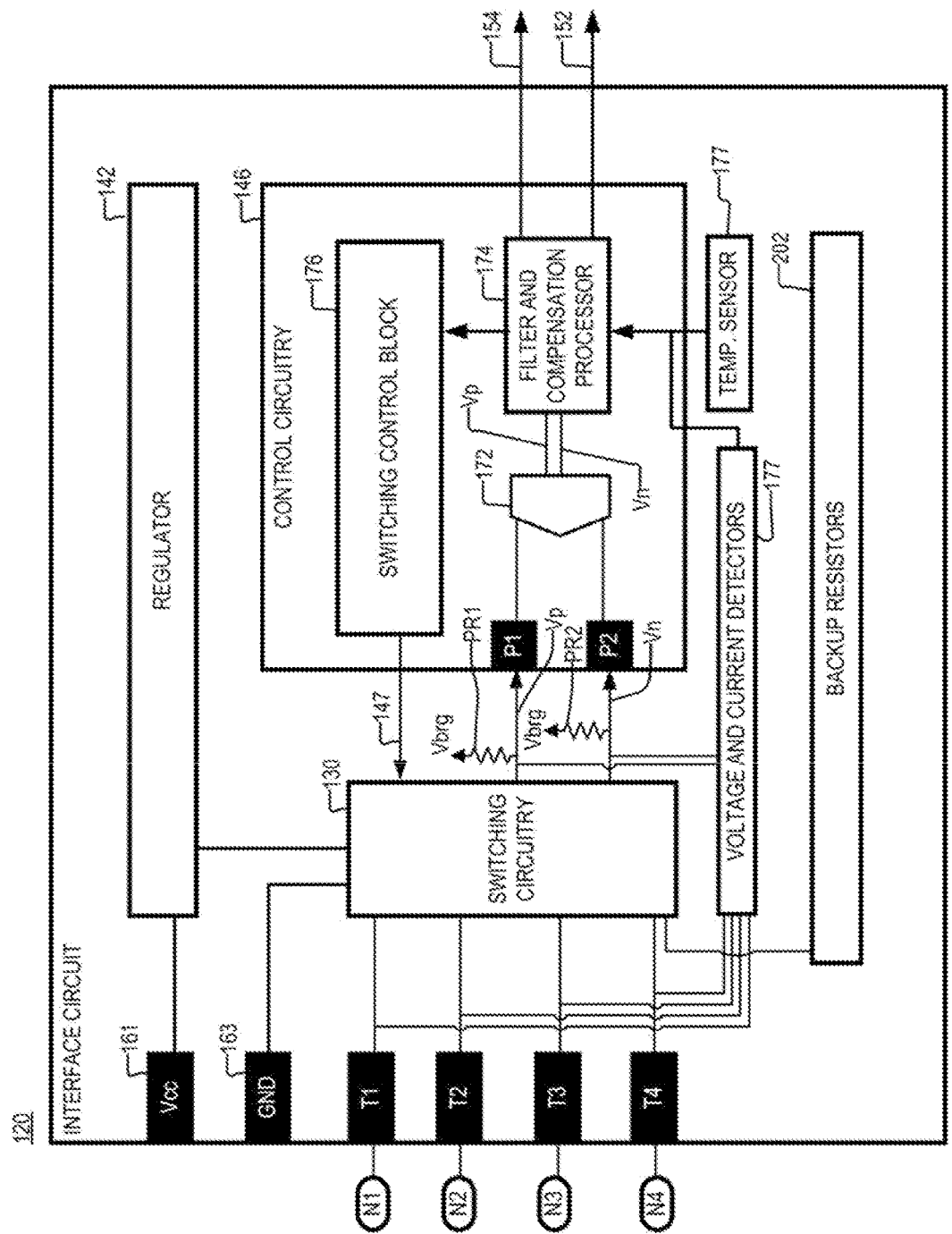
FIG. 2A is a diagram of an example of an interface circuit, according to aspects of the disclosure.

FIG. 2A is a schematic diagram of the interface circuit 120 in accordance with another implementation. Unlike the implementation discussed with respect to FIG. 1C, in this implementation, the interface circuit 120 may include one or more backup resistors, and the switching circuitry 130 may include additional switches for connecting any of the backup resistors 202 between any of the terminals T1-T4. In this implementation, the interface circuit 120 may also include pull-up resistors PR1 and PR2, which are arranged to pull up the voltage at internal ports P1 and P2, respectively.

The backup resistors 202 may be used to maintain the functionality of the sensing bridge 110 when any of the sensing elements R1-R4 fails. For example, when any of the sensing elements R1-R4 is open, the control circuitry 146 may cause the switching circuitry 130 to connect one of the backup resistors 202 in parallel with the shorted sensing element (e.g., see FIGS. 2E-H). As another example, when the sensing bridge 110 loses reception of the voltage signal Vbrg, the control circuitry 146 may cause the switching circuitry 130 to connect a network of serially-coupled backup resistors between terminals T1 and T2 (and between nodes N1-N2), and supply the signal Vbrg at the connection between any two of the serially-coupled resistors (e.g., see FIG. 2C). As yet another example, when the sensing bridge 110 loses reception of the ground signal Bgnd, the control circuitry 146 may cause the switching circuitry 130 to connect a network of serially-coupled backup resistors between terminals T1 and T2 (and between nodes N1-N2), and supply the ground signal Bgnd at the connection between any two of the serially-coupled resistors (e.g., see FIG. 2D). According to the present example, the backup resistors 202 are integrated into the same packaging as the interface circuit 120 (e.g., the backup resistors 202 are internal to the interface circuit 120). However, it will be understood that alternative implementations are possible in which the backup resistors 202 are provided separately from the interface circuit 120.

The pull-up resistor PR1 may be configured to pull up the voltage at internal port P1 to the value of Vbrg when the internal port P1 loses connection to sensing bridge 110 (and/or when the internal port P1 losses reception of the signal Vp). As is discussed further below, when the internal port P1 loses connection to the sensing bridge 110, the pull-up resistor PR1 may enable the interface circuit 120 to detect that the port P1 has lost connection to the sensing bridge 110 and trigger the activation of one or more of the back-up resistors 202, causing the one or ore of the backup resistors 202 to apply voltage Vbrg/2 at the internal port P1. The pull-up resistor PR2 may be configured to pull up the voltage at internal port P2 to the value of Vbrg when the internal port P2 loses connection to sensing bridge 110 (and/or when the internal port P2 losses reception of the signal Vn). As is discussed further below, when the internal port P2 loses connection to the sensing bridge 110, the pull-up resistor PR2 may enable the interface circuit 120 to detect that the port P2 has lost connection to the sensing bridge 110 and trigger the activation of one or more of the back-up resistors 202, causing the one or more of the backup resistors 202 to apply voltage Vbrg/2 at the internal port P2. Although in the example of FIG. 1, the resistors PR1 and PR2 are pull-up resistors, alternative implementations are possible in which any of the resistors PR1 and PR2 is a pull-down resistor (e.g., a pull-down resistor connected to ground).

Figure 2B:
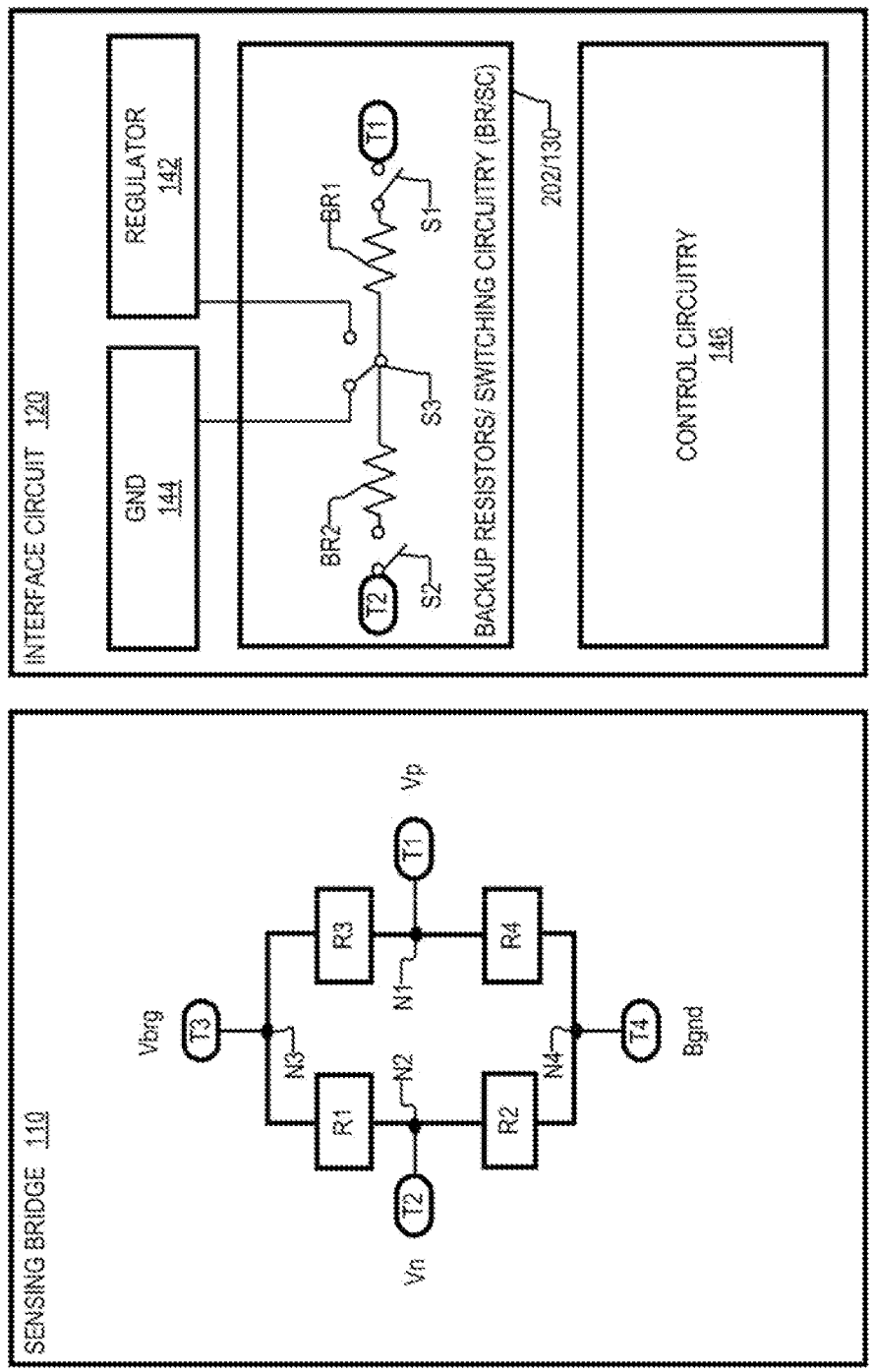
FIG. 2B is a diagram illustrating an example of a connection profile for an interface circuit, according to aspects of the disclosure.

FIG. 2B is a diagram showing the state of backup resistors 202 when the sensing bridge 110 is coupled to the interface circuit 120 in accordance with the regular connection profile CP_REG. According to the example of FIG. 2B, the backup resistors 202 include a backup resistor BR1 and a backup resistor BR2 that is coupled in series with the backup resistor BR1. Furthermore, according to the example of FIG. 2B, the switching circuitry 130 includes a switch S1, a switch S2, and a switch S3. Switch S1 may be configured to couple backup resistor BR1 to terminal T1; switch S2 may be configured to couple backup resistor BR2 to terminal T2, and switch S2 may be configured to couple backup resistors BR1 and BR2 to one of the voltage regulator 142 and the ground source 144.

It will be recalled that when the sensing bridge 110 is coupled to the interface circuit 120 in accordance with the regular connection profile, the voltage signal Vbrg is applied at node N3 of the sensing bridge, the ground signal Bgnd is applied at node N4 of the sensing bridge 110, the internal port P1 of the control circuitry 146 is coupled to node N1 of the sensing bridge 110, and the internal port P2 of the control circuitry 146 is coupled to node N2 of the sensing bridge 110. As illustrated, when the sensing bridge 110 is coupled to the interface circuit 120 in accordance with the regular profile, the backup resistors BR2 and BR1 are disconnected from the sensing bridge 110.

Figure 2C:
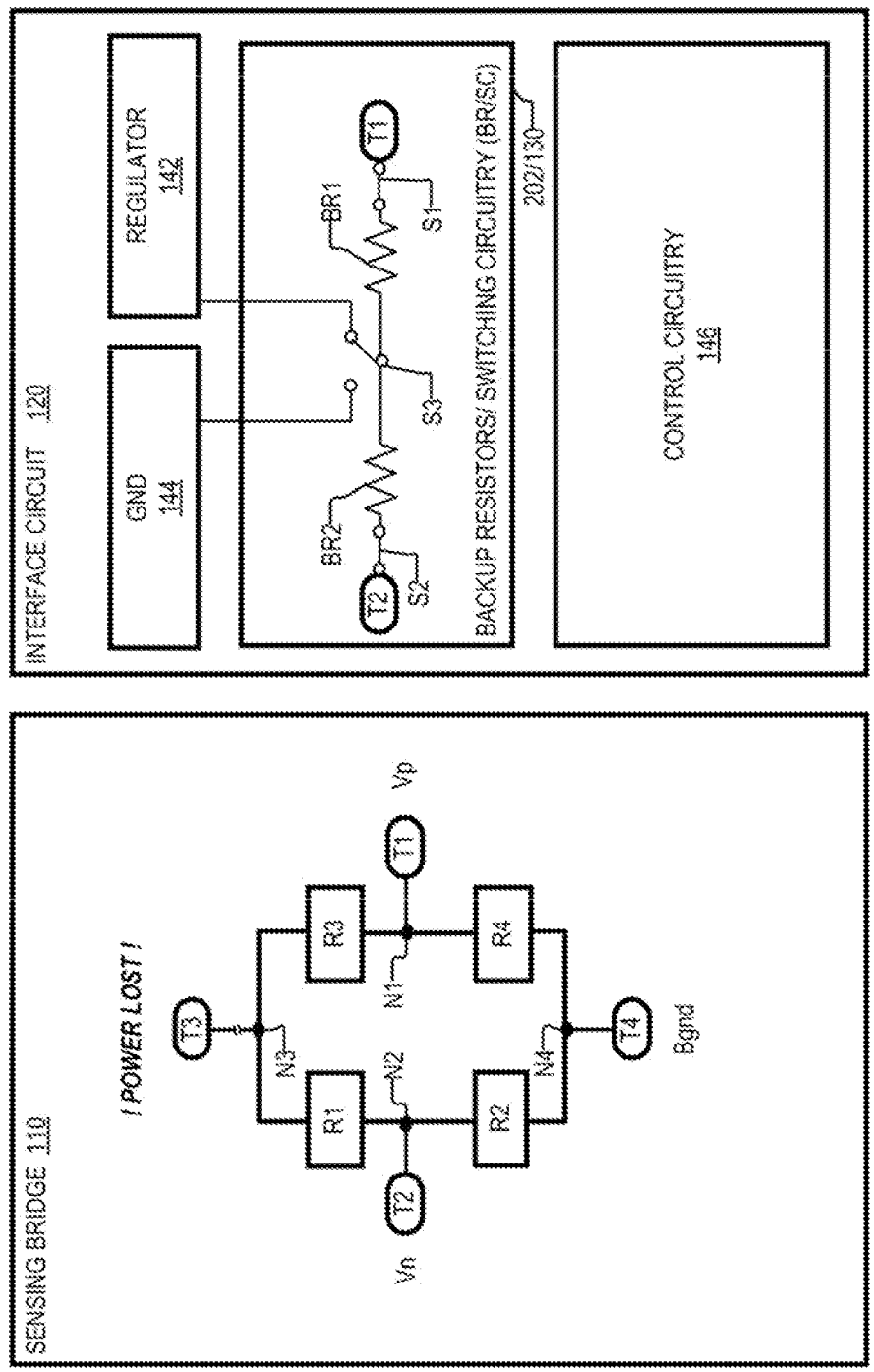
FIG. 2C is a diagram illustrating an example of a connection profile for an interface circuit, according to aspects of the disclosure.

FIG. 2C shows the sensing bridge 110 when the sensing bridge 110 is coupled to the interface circuit 120 in accordance with a third connection profile CP_3. As illustrated, when the sensing bridge 110 is coupled to the interface circuit 120 in accordance with the third connection profile CP_3, backup resistors BR1 and BR2 are coupled to terminals T1 and T2 by switches S1 and S2, respectively. Furthermore, when the sensing bridge 110 is coupled to the interface circuit 120 in accordance with the third connection profile CP_3, backup resistors BR1 and BR2 may be coupled to the voltage regulator 142. In some respects, the sensing bridge 110 may be coupled to the interface circuit 120 in accordance with the third connection profile CP_3 when the connection between the voltage regulator 142 and the sensing bridge 110 has failed, and the sensing bridge 110 has stopped receiving power from the interface circuit 120 as a result. Connecting the sensing bridge 110 in accordance with the third connection profile CP_3 may effectively cause sensing elements R1 and R3 to be replaced with backup resistors BR1 and BR2, respectively.

Figure 2D:
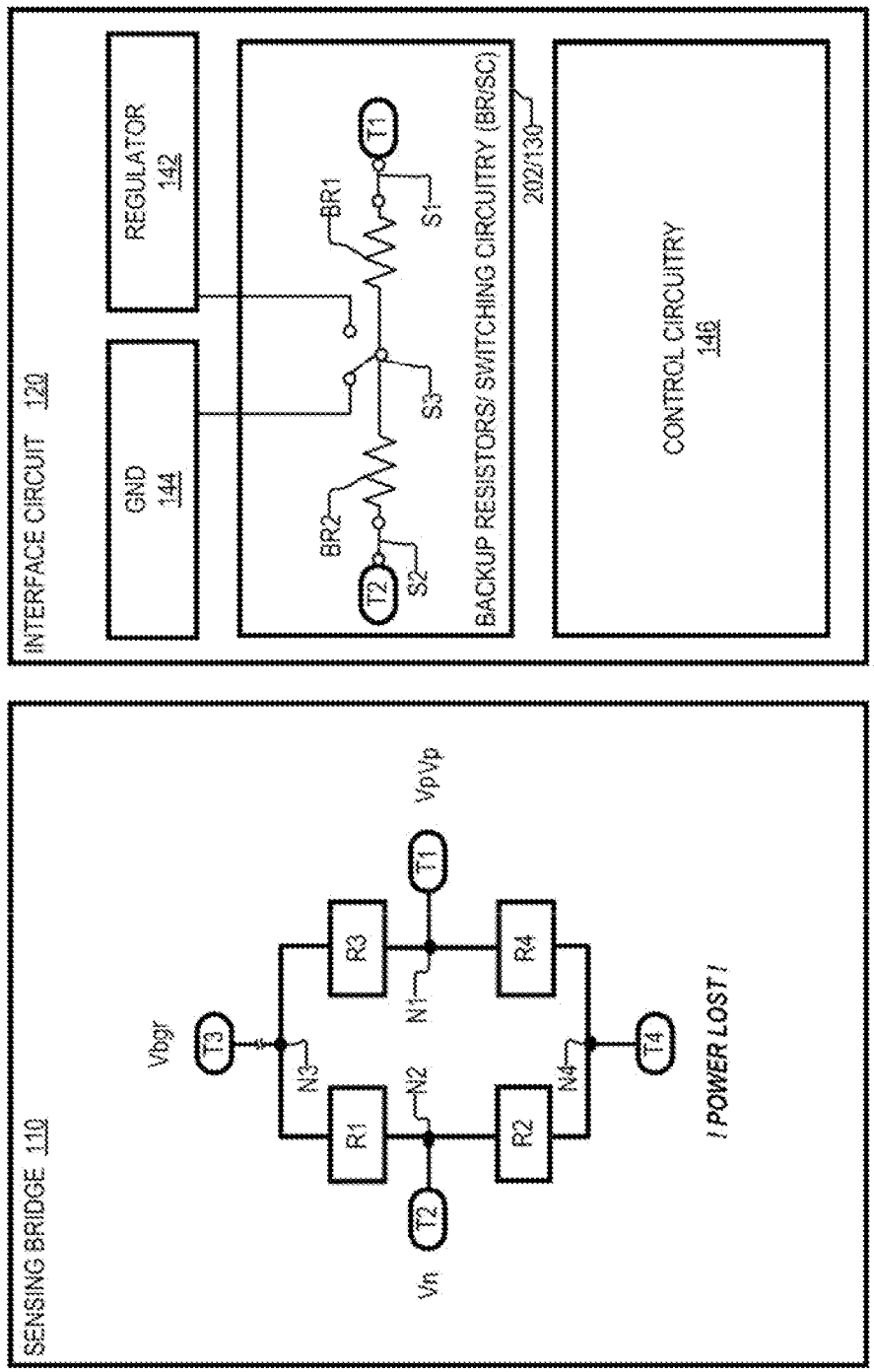
FIG. 2D is a diagram illustrating an example of a connection profile for an interface circuit, according to aspects of the disclosure.

FIG. 2D shows the sensing bridge 110 when the sensing bridge 110 is coupled to the interface circuit 120 in accordance with a fourth connection profile CP_4. As illustrated, when the sensing bridge 110 is coupled to the interface circuit 120 in accordance with the fourth connection profile CP_4, backup resistors BR1 and BR2 are coupled to terminals T1 and T2 by switches S1 and S2, respectively. Furthermore, when the sensing bridge 110 is coupled to the interface circuit 120 in accordance with the fourth connection profile CP_4, backup resistors BR1 and BR2 are coupled to the ground source 144. In some respects, the sensing bridge 110 may be coupled to the interface circuit 120 in accordance with the fourth connection profile CP_4 when the connection between the voltage regulator 142 and the sensing bridge 110 has failed, and the sensing bridge 110 has stopped receiving the ground signal Bgnd from the interface circuit 120 as a result. Connecting the sensing bridge 110 in accordance with the fourth connection profile CP_4 may effectively cause sensing elements R2 and R4 to be replaced with backup resistors BR1 and BR2, respectively.

Figure 2E:
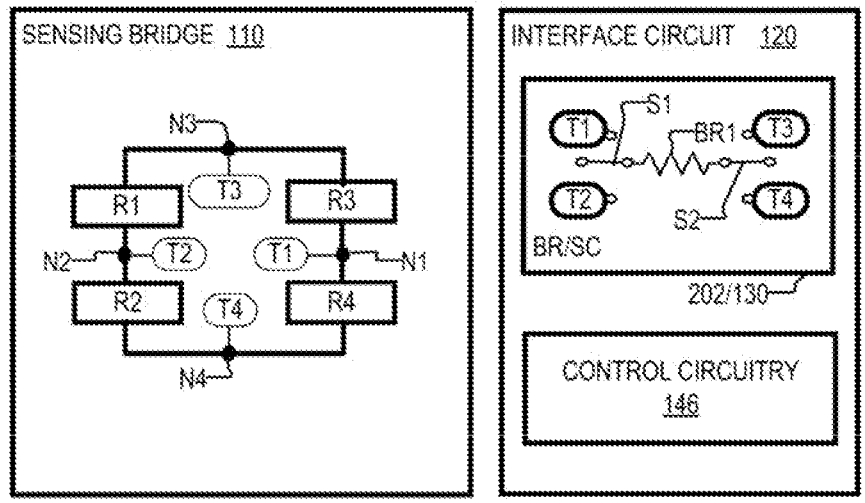
FIG. 2E is a diagram illustrating an example of a connection profile for an interface circuit, according to aspects of the disclosure.

FIG. 2E is a diagram showing the state of backup resistors 202 when the sensing bridge 110 is coupled to the interface circuit 120 in accordance with the regular connection profile CP_REG. According to the example of FIG. 2E, the backup resistors 202 include a backup resistor BR1. Furthermore, according to the example of FIG. 2E, the switching circuitry 130 includes a switch S1 and a switch S2. Switches S1 and S2 are configured to couple the backup resistor BR1 between any two of the terminals T1-T4. As illustrated, when the sensing bridge 110 is coupled to the interface circuit 120 in accordance with the regular connection profile CP_REG, the backup resistor BR1 may be disconnected from the sensing bridge 110.

Figure 2F:
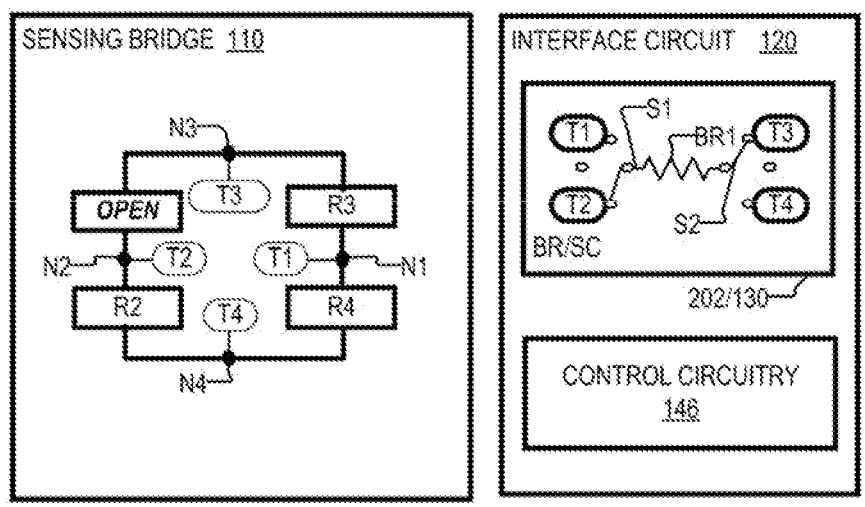
FIG. 2F is a diagram illustrating an example of a connection profile for an interface circuit, according to aspects of the disclosure.

FIG. 2F shows the sensing bridge 110 when the sensing bridge 110 is coupled to the interface circuit 120 in accordance with a fifth connection profile CP_5. As illustrated, when the sensing bridge 110 is coupled to the interface circuit 120 in accordance with the fifth connection profile CP_5, the switches S1 and S2 are arranged to couple the backup resistor BR1 between terminals T2 and T3. In some respects, the sensing bridge 110 may be coupled to the interface circuit 120 in accordance with the fifth connection profile CP_5 when the sensing element R1 fails and becomes open as a result. Connecting the sensing bridge 110 in accordance with the fifth connection profile CP_5 may effectively cause the sensing element R1 to be replaced with the backup resistor BR1.

Figure 2G:
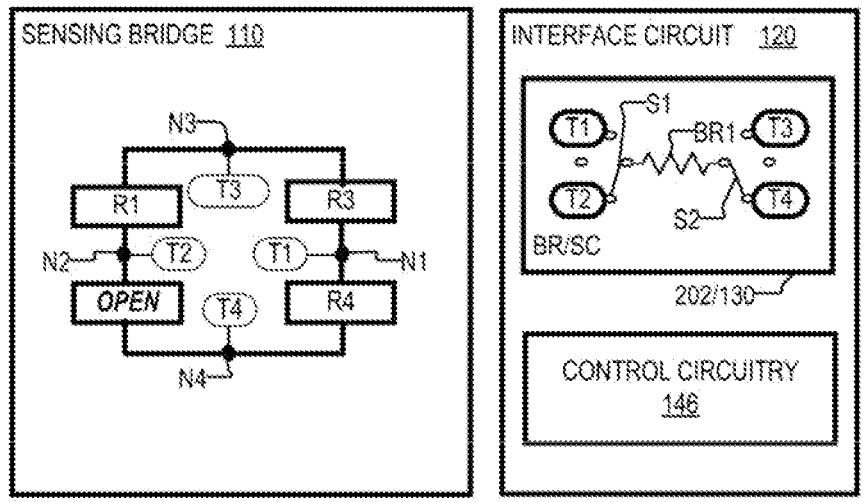
FIG. 2G is a diagram illustrating an example of a connection profile for an interface circuit, according to aspects of the disclosure.

FIG. 2G shows the sensing bridge 110 when the sensing bridge 110 is coupled to the interface circuit 120 in accordance with a sixth connection profile CP_6. As illustrated, when the sensing bridge 110 is coupled to the interface circuit 120 in accordance with the sixth connection profile CP_6, the switches S1 and S2 are arranged to couple the backup resistor BR1 between terminals T2 and T4. In some respects, the sensing bridge 110 may be coupled to the interface circuit 120 in accordance with the sixth connection profile CP_6 when the sensing element R2 fails and becomes open as a result. Connecting the sensing bridge 110 in accordance with the sixth connection profile CP_6 may effectively cause the sensing element R2 to be replaced with the backup resistor BR1.

Figure 2H:
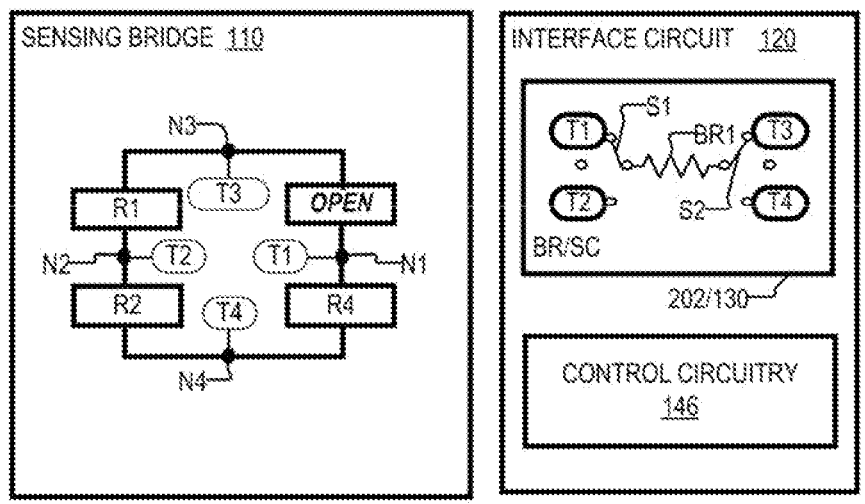
FIG. 2H is a diagram illustrating an example of a connection profile for an interface circuit, according to aspects of the disclosure.

FIG. 2H shows the sensing bridge 110 when the sensing bridge 110 is coupled to the interface circuit 120 in accordance with a seventh connection profile CP_7. As illustrated, when the sensing bridge 110 is coupled to the interface circuit 120 in accordance with the seventh connection profile CP_7, the switches S1 and S2 are arranged to couple the backup resistor BR1 between terminals T1 and T3. In some respects, the sensing bridge 110 may be coupled to the interface circuit 120 in accordance with the seventh connection profile CP_7 when the sensing element R3 fails and becomes open as a result. Connecting the sensing bridge 110 in accordance with the seventh connection profile CP_7 may effectively cause the sensing element R3 to be replaced with the backup resistor BR1.

Figure 2I:
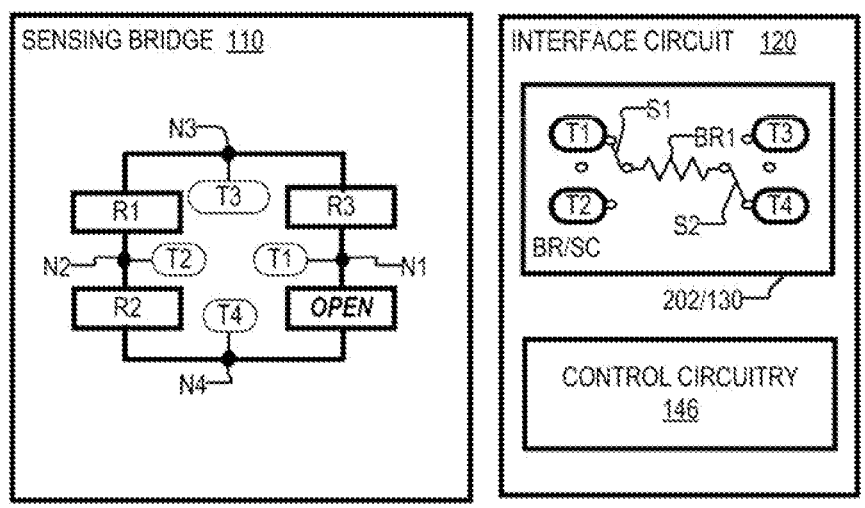
FIG. 2I is a diagram illustrating an example of a connection profile for an interface circuit, according to aspects of the disclosure.

FIG. 2I shows the sensing bridge 110 when the sensing bridge 110 is coupled to the interface circuit 120 in accordance with an eighth connection profile CP_8. As illustrated, when the sensing bridge 110 is coupled to the interface circuit 120 in accordance with the eighth connection profile CP_8, the switches S1 and S2 are arranged to couple the backup resistor BR1 between terminals T1 and T4. In some respects, the sensing bridge 110 may be coupled to the interface circuit 120 in accordance with the eighth connection profile CP_8 when the sensing element R4 fails and becomes open as a result. Connecting the sensing bridge 110 in accordance with the eighth connection profile CP_8 may effectively cause the sensing element R4 to be replaced with the backup resistor BR1.

Figure 2J:
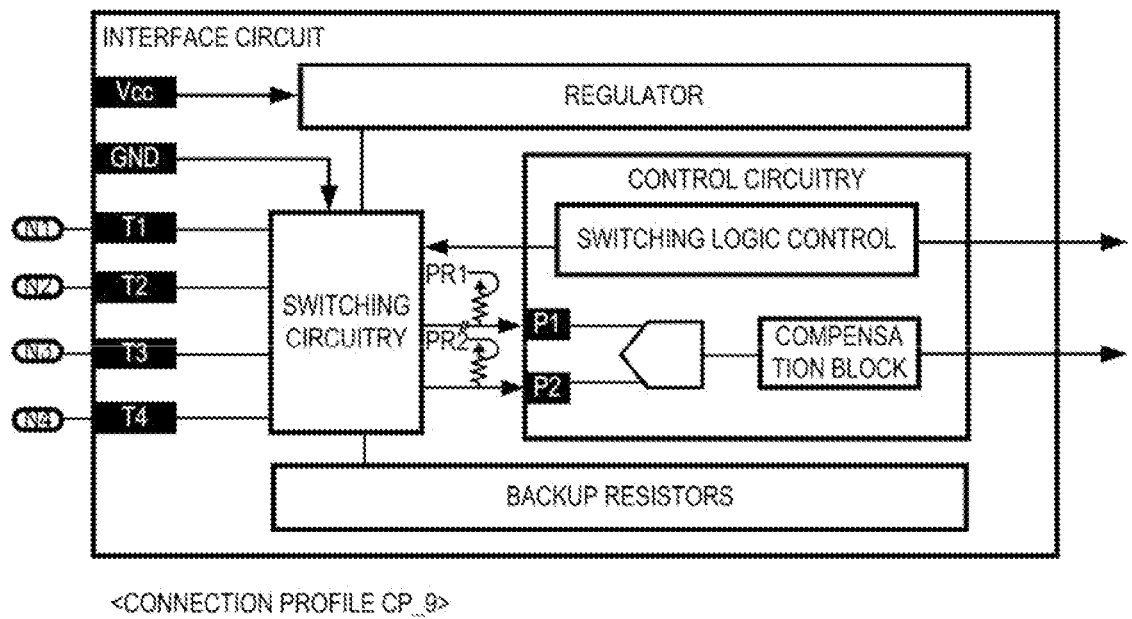
FIG. 2J is a diagram illustrating an example of a connection profile for an interface circuit, according to aspects of the disclosure.

FIG. 2J shows the sensing bridge 110 when the sensing bridge 110 is coupled to the interface circuit 120 in accordance with a ninth connection profile CP_9. As illustrated, when the sensing bridge 110 is coupled to the interface circuit 120 in accordance with the ninth connection profile CP_9, the internal port P1 of the control circuitry 146 is disconnected from the sensing bridge, and the voltage at the internal port P1 is set to Vbrg/2 by one or more the backup resistors 202. In some respects, the sensing bridge 110 may be coupled to the interface circuit 120 in accordance with the ninth connection profile CP_9 when the internal port P1 becomes disconnected from the sensing bridge 110 as a result of the failure of the connection between the internal port P1 and the sensing bridge 110.

Figure 2K:
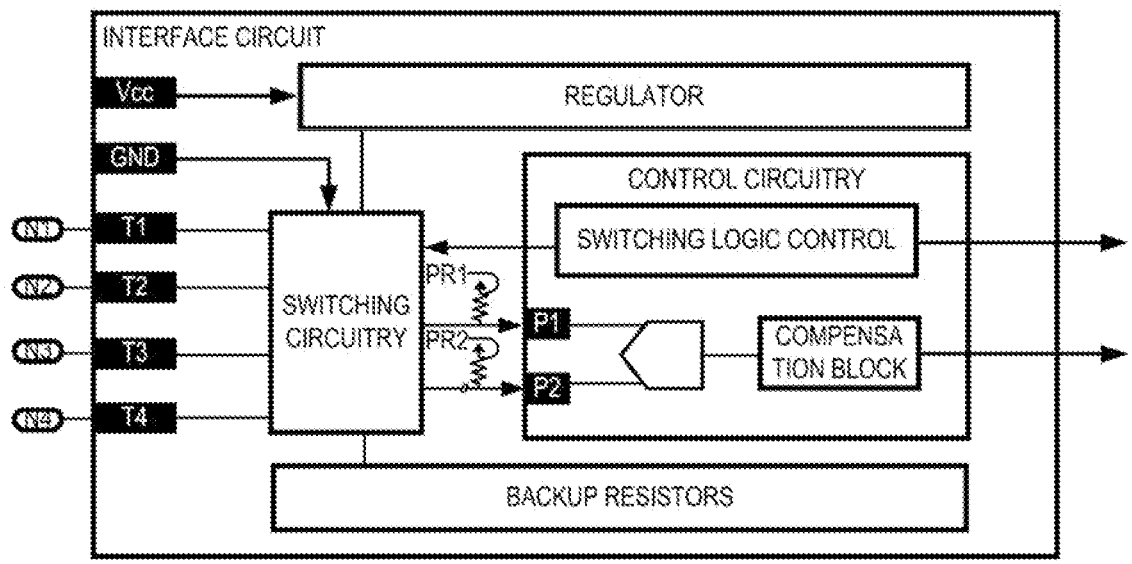
FIG. 2K is a diagram illustrating an example of a connection profile for an interface circuit, according to aspects of the disclosure.

FIG. 2K shows the sensing bridge 110 when the sensing bridge 110 is coupled to the interface circuit 120 in accordance with a tenth connection profile CP_10. As illustrated, when the sensing bridge 110 is coupled to the interface circuit 120 in accordance with the tenth connection profile CP_10, the internal port P2 of the control circuitry 146 is disconnected from the sensing bridge, and the voltage at the internal port P2 is set to Vbrg/2 by one or more the backup resistors 202. In some respects, the sensing bridge 110 may be coupled to the interface circuit 120 in accordance with the tenth connection profile CP_10 when the internal port P2 becomes disconnected from the sensing bridge 110 as a result of the failure of the connection between the internal port P2 and the sensing bridge 110. FIG. 2L depicts an example of a truth table 280, which describes the operation of the interface circuit 120 in further detail. Truth table 280 has the same format as truth table 180. Unlike truth table 180, truth table 280 identifies alternative actions that are taken by the interface circuit 120 when any of the sensing elements R1-R1 is open, and which utilize backup resistors 202. Furthermore, unlike truth table 180, truth table 280 identifies alternative actions that are taken by the interface circuit 120 when any of the sensing elements R1-R1 is shorted, and which utilize backup resistors 202. And still furthermore, unlike truth table 180, truth table 280 identifies alternative actions that are taken by the interface circuit 120 when the interface circuit loses reception of any of the signals Vp or Vn, and which utilize backup resistors 202.

In operation, the control circuitry 146 (which is part of the interface circuit 120) may detect when there is a failure in the sensing bridge 110 and/or a connection between the sensing bridge 110 and the interface circuit 120. As discussed above with respect to FIG. 1F, the failure may be detected by monitoring one or more of: (1) the voltage at terminal T1 of the sensing bridge 110, (2) the voltage at terminal T2 of the sensing bridge 110, (3) the voltage at terminal T3 of the sensing bridge 110, (4) the voltage at terminal T4 of the sensing bridge 110, (4) the common-mode voltage Vcm of the sensing bridge 110, and the current across the sensing bridge 110. When such failure is detected, the control circuitry 146 may cause the switching circuitry 130 to change the connection profile of the sensing bridge 110.

Row 273A identifies the state of the interface circuit 120 (and/or sensing bridge 110) when the sensing bridge 110 and the interface circuit 120 are operating correctly. Specifically, row 273A indicates that when no failures are present: (i) the voltage at terminal T3 would be equal to Vbrg; (ii) the voltage at terminal T1 would be equal to Vbrg/2; (iii) the voltage at terminal T2 would be equal to Vbrg/2; (iv) the voltage at terminal T4 would be equal to 0; (v) the common-mode voltage Vcm of the sensing bridge 110 would be equal to Vbrg/2; (vi) the current across the sensing bridge 110 would be equal to NC. Furthermore, row 273A indicates that when the sensing bridge 110 and the interface circuit 120 are operating correctly, the sensing bridge 110 may be connected to the interface circuit 120 in accordance with the regular connection profile CP_REG, and the signal processing profile of the interface circuit 120 may be SIG_NP.

Row 273B identifies the state of the interface circuit 120 (and/or sensing bridge 110) when the sensing bridge 110 loses reception of the voltage signal Vbrg from the interface circuit 120 (e.g., due to a failure of a connection between the sensing bridge 110 and the interface circuit 120). Specifically, row 273B indicates that when the sensing bridge 110 no longer receives the voltage signal Vbrg from the interface circuit 120: (i) the voltage at terminal T3 would be floating; (ii) the voltage at terminal T1 would be equal to 0; (iii) the voltage at terminal T2 would be equal to 0; (iv) the voltage at terminal T4 would be equal to 0; (v) the common-mode voltage Vcm of the sensing bridge 110 would be equal to 0; and (vi) the current across the sensing bridge 110 would be equal to 0. Row 273B also indicates that when the sensing bridge 110 loses reception of the voltage signal Vbrg, the control circuitry 146 may transition the sensing bridge 110 from the regular connection profile CP_REG to the third connection profile CP_3. Row 273B further indicates that when the sensing bridge 110 is coupled to the interface circuit 120 in accordance with the third connection profile CP_3, the interface circuit 120 may continue operating in accordance with signal processing profile SIG_NP. However, the interface circuit may set the degraded-accuracy flag 154 to the first value, which indicates that the output data 152 has a reduced accuracy.

Row 273C identifies the state of the interface circuit 120 (and/or sensing bridge 110) when the sensing bridge 110 loses reception of the ground signal Bgnd from the interface circuit 120 (e.g., due to a failure of a connection between the sensing bridge 110 and the interface circuit 120). Specifically, row 273C indicates that when the sensing bridge 110 no longer receives the ground signal Bgnd from the interface circuit 120: (i) the voltage at terminal T3 would be equal to Vbrg; (ii) the voltage at terminal T1 would be equal to Vbrg; (iii) the voltage at terminal T2 would be equal to Vbrg; (iv) the voltage at terminal T4 would be floating; (v) the common-mode voltage Vcm of the sensing bridge 110 would be equal to Vbrg; and (vi) the current across the sensing bridge 110 would be equal to 0. Row 273C also indicates that when the sensing bridge 110 loses reception of the ground signal Bgnd, the control circuitry 146 may transition the sensing bridge 110 from the regular connection profile CP_REG to the fourth connection profile CP_4. Row 273C further indicates that when the sensing bridge 110 is coupled to the interface circuit 120 in accordance with the fourth connection profile CP_4, the interface circuit 120 may continue operating in accordance with signal processing profile SIG_NP. However, the interface circuit may set the degraded-accuracy flag 154 to the first value, which indicates that the output data 152 has a reduced accuracy.

Row 273D identifies the state of the interface circuit 120 (and/or sensing bridge 110) when the sensing element R1 is open. Specifically, row 273D indicates that when the sensing element R1 is open: (i) the voltage at terminal T3 would be equal to Vbrg; (ii) the voltage at terminal T1 would be equal to Vbrg/2; (iii) the voltage at terminal T2 would be equal to 0; (iv) the voltage at terminal T4 would be equal to 0; (v) the common-mode voltage Vcm of the sensing bridge 110 would be substantially less than Vbrg/2; and (vi) the current across the sensing bridge 110 would be substantially less than NC. Row 273D also indicates that when the sensing element R1 becomes open, the control circuitry 146 may transition the sensing bridge 110 from the regular connection profile CP_REG to the fifth connection profile CP_5. Row 273D further indicates that when the sensing bridge 110 is coupled to the interface circuit 120 in accordance with the fifth connection profile CP_5, the interface circuit 120 may continue operating in accordance with signal processing profile SIG_NP. However, the interface circuit may set the degraded-accuracy flag 154 to the first value, which indicates that the output data 152 has a reduced accuracy.

Row 273E identifies the state of the interface circuit 120 (and/or sensing bridge 110) when the sensing element R2 is open. Specifically, row 273E indicates that when the sensing element R2 is open: (i) the voltage at terminal T3 would be equal to Vbrg; (ii) the voltage at terminal T1 would be equal to Vbrg/2; (iii) the voltage at terminal T2 would be equal to Vbrg; (iv) the voltage at terminal T4 would be equal to 0; (v) the common-mode voltage Vcm of the sensing bridge 110 would be substantially greater than Vbrg/2; and (vi) the current across the sensing bridge 110 would be substantially less than NC. Row 273E also indicates that when the sensing element R2 becomes open, the control circuitry 146 may transition the sensing bridge 110 from the regular connection profile CP_REG to the sixth connection profile CP_6. Row 273E further indicates that when the sensing bridge 110 is coupled to the interface circuit 120 in accordance with the sixth connection profile CP_6, the interface circuit 120 may continue operating in accordance with signal processing profile SIG_NP. However, the interface circuit may set the degraded-accuracy flag 154 to the first value, which indicates that the output data 152 has a reduced accuracy.

Row 273F identifies the state of the interface circuit 120 (and/or sensing bridge 110) when the sensing element R3 is open. Specifically, row 273F indicates that when the sensing element R3 is open: (i) the voltage at terminal T3 would be equal to Vbrg; (ii) the voltage at terminal T1 would be equal to 0; (iii) the voltage at terminal T2 would be equal to Vbrg/2; (iv) the voltage at terminal T4 would be equal to 0; (v) the common-mode voltage Vcm of the sensing bridge 110 would be substantially less than Vbrg/2; and (vi) the current across the sensing bridge 110 would be substantially less than NC. Row 273F also indicates that when the sensing element R3 becomes open, the control circuitry 146 may transition the sensing bridge 110 from the regular connection profile CP_REG to the seventh connection profile CP_7. Row 273F further indicates that when the sensing bridge 110 is coupled to the interface circuit 120 in accordance with the seventh connection profile CP_7, the interface circuit 120 may continue operating in accordance with signal processing profile SIG_NP. However, the interface circuit may set the degraded-accuracy flag 154 to the first value, which indicates that the output data 152 has a reduced accuracy.

Row 273G identifies the state of the interface circuit 120 (and/or sensing bridge 110) when the sensing element R4 is open. Specifically, row 273G indicates that when the sensing element R4 is open: (i) the voltage at terminal T3 would be equal to Vbrg; (ii) the voltage at terminal T1 would be equal to Vbrg; (iii) the voltage at terminal T2 would be equal to Vbrg/2; (iv) the voltage at terminal T4 would be equal to 0; (v) the common-mode voltage Vcm of the sensing bridge 110 would be substantially greater than Vbrg/2; and (vi) the current across the sensing bridge 110 would be substantially less than NC. Row 273G also indicates that when the sensing element R4 becomes open, the control circuitry 146 may transition the sensing bridge 110 from the regular connection profile CP_REG to the eighth connection profile CP_8. Row 273G further indicates that when the sensing bridge 110 is coupled to the interface circuit 120 in accordance with the eighth connection profile CP_8, the interface circuit 120 may continue operating in accordance with signal processing profile SIG_NP. However, the interface circuit may set the degraded-accuracy flag 154 to the first value, which indicates that the output data 152 has a reduced accuracy.

Row 273H identifies the state of the interface circuit 120 (and/or sensing bridge 110) when the interface circuit 120 loses reception of the signal Vp at the internal port P1. Specifically, row 273H indicates that when the connection between the internal port P1 and the sensing bridge 110 is open: (i) the voltage at terminal T3 would be equal to Vbrg; (ii) the voltage at terminal T1 would be floating; (iii) the voltage at terminal T2 would be equal to Vbrg/2; (iv) the voltage at terminal T4 would be equal to 0; and (v) the common-mode voltage Vcm of the sensing bridge 110 would be substantially greater than Vbrg/2; and (vi) the current across the sensing bridge 110 would be substantially less than NC. Row 273H also indicates that when the connection between the internal port P1 and the sensing bridge 110 becomes open, the sensing bridge 110 may assume the ninth connection profile CP_9 (e.g., by virtue of the internal port P1 being disconnected from the sensing bridge 110). Row 273H further indicates that when the sensing bridge 110 is coupled to the interface circuit 120 in accordance with the ninth connection profile CP_9, the interface circuit 120 may continue operating in accordance with signal processing profile SIG_NP. However, the interface circuit may set the degraded-accuracy flag 154 to the first value, which indicates that the output data 152 has a reduced accuracy.

Row 273I identifies the state of the interface circuit 120 (and/or sensing bridge 110) when the interface circuit 120 loses reception of the signal Vn at the internal port P2. Specifically, row 273I indicates that when the connection between the internal port P2 and the sensing bridge 110 is open: (i) the voltage at terminal T3 would be equal to Vbrg; (ii) the voltage at terminal T1 would be equal to Vbrg/2; (iii) the voltage at terminal T2 would be floating; (iv) the voltage at terminal T4 would be equal to 0; and (v) the common-mode voltage Vcm of the sensing bridge 110 would be substantially greater than Vbrg/2; and (vi) the current across the sensing bridge 110 would be substantially less than NC. Row 273I further indicates that when the sensing bridge 110 is coupled to the interface circuit 120 in accordance with the tenth connection profile CP_10, the interface circuit 120 may continue operating in accordance with signal processing profile SIG_NP. However, the interface circuit may set the degraded-accuracy flag 154 to the first value, which indicates that the output data 152 has a reduced accuracy.

Figure 3:
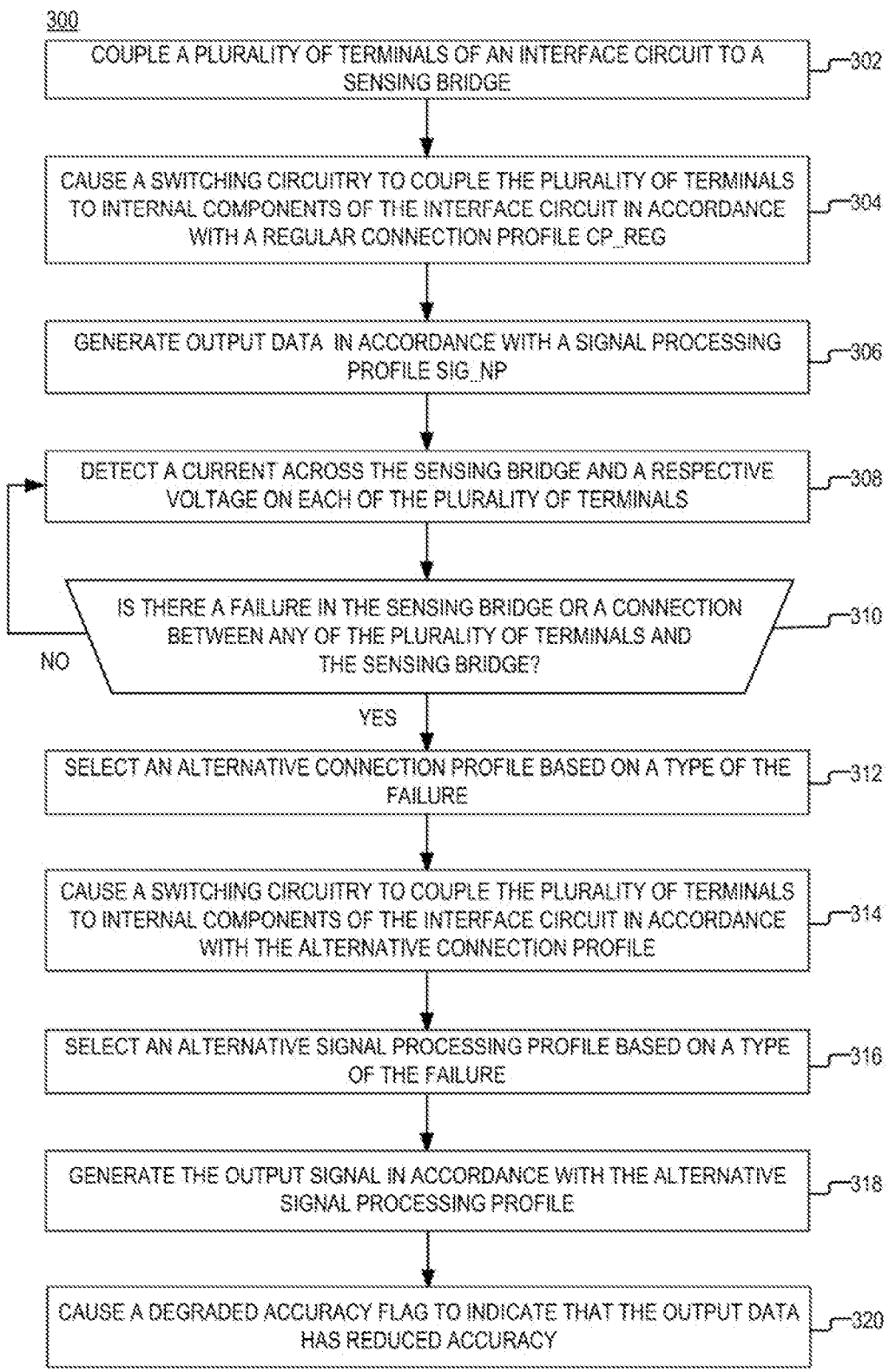
FIG. 3 is a flowchart of an example of a process, according to aspects of the disclosure.

FIG. 3 is flowchart of an example of a process 300, according to aspects of the disclosure. According to the example of FIG. 3, the process 300 is substantially performed by the control circuitry 146 of the interface circuit 120. However, it will be understood that alternative implementations are possible in which the process 300 is performed by another system component. Stated succinctly, the present disclosure is not limited to any specific implementation of the process 300.

At step 302, the sensing bridge 110 is coupled to the interface circuit 120. More particularly, node N1 of the sensing bridge is coupled to terminal T1 of the interface circuit 120; node N2 of the sensing bridge is coupled to terminal T2 of the interface circuit 120; node N3 of the sensing bridge is coupled to terminal T3 of the interface circuit 120; and node N4 of the sensing bridge is coupled to terminal T4 of the interface circuit 120.

At step 304, the control circuitry 146 causes the switching circuitry 130 to couple the sensing bridge 110 to the voltage regulator 142, the ground source 144, and the filter and compensation processor 174 in accordance with the regular connection profile CP_REG. (E.g., see FIG. 1A, FIG. 2B, or FIG. 2E.)

At step 306, the control circuitry 146 generates the output data 152 in accordance with the signal processing profile SIG_NP.

At step 308, the control circuitry 146 detects one or more of the current across the sensing bridge 110, and the voltage at each (or any) of the terminals T1-T4 of the interface circuit 120.

At step 310, the control circuitry 146 determines whether there is a failure in the sensing bridge 110 or a connection between any of the terminals T1-T4 and the sensing bridge 110. The determination may be made based on one or more of the following values: (i) the level of the current across the bridge, (ii) the voltage level at terminal T1, (iii) the voltage level at terminal T2, (iv) the voltage level at terminal T3, and (v) the voltage level at terminal T4. In some implementations, the control circuitry 146 may determine that a failure exists when the detected values match the values listed in any of rows 173B-M of table 180. (E.g., see FIG. 1F.) Additionally or alternatively, in some implementations, the control circuitry 146 may determine that a failure exists when the detected values match the values listed in any of rows 273B-I of table 280. (E.g., see FIG. 2L.) Additionally or alternatively, in some implementations, the control circuitry 146 may determine that no failures exist when the detected values match the values listed in row 173A of table 180. (E.g., see FIG. 1F.) Additionally or alternatively, in some implementations, the control circuitry 146 may determine that no failures exist when the detected values match the values listed in row 273A of table 280. (E.g., see FIG. 2L.) If a failure is detected, the process 300 proceeds to step 312. Otherwise, step 310 is executed again.

At step 312, the control circuitry 146 selects an alternative connection profile based on a type of the failure that is detected at step 310. In some implementations, selecting the alternative profile may include: (i) selecting one the tables 180 and 280; (ii) identifying a row in the selected table that matches the values detected at step 308; and (iii) identifying an alternative connection profile that is identified in the row. As discussed above with respect to FIGS. 1F and 2L, the alternative connection profile may be any of the connection profiles CP1-10, which are discussed above with respect to FIGS. 1D, 2C-D, and 2F-I.

At step 314, the control circuitry 146 causes the switching circuitry 130 to couple the sensing bridge 110 to the voltage regulator 142, the ground source 144, and the filter and compensation processor 174 in accordance with the alternative connection profile.

At step 316, the control circuitry 146 selects an alternative signal processing profile based on a type of the failure that is detected at step 310. In some implementations, selecting the alternative profile may include: (i) selecting one the tables 180 and 280; (ii) identifying a row in the selected table that matches the values detected at step 308; and (iii) identifying an alternative signal processing profile that is identified in the row. As discussed above with respect to FIG. 1E, the alternative signal processing profile may include either the signal processing profile SIG_N or the signal processing profile SIG_P.

At step 318, the control circuitry 146 generates the output data 152 in accordance with the alternative signal processing profile. As noted above, in some implementations, the signal processing profile may remain unchanged. When this is the case, the output data 152 may be generated in accordance with the signal processing profile SIG_NP.

At step 320, the control circuitry 146 sets the degraded-accuracy flag 154 to the first value, which indicates that the output data 152 has a reduced accuracy.

FIG. 3 is provided as an example. At least some of the steps discussed with respect to FIG. 3 can be performed in a different order, in parallel, or altogether omitted. For example, in some implementations, step 316 may be omitted.

According to the example of FIGS. 1A-3, the sensing bridge 110 and the interface circuit 120 are separate from one another. However, alternative implementations are possible in which the sensing bridge 110 and the interface circuit 120 are integrated with one another (e.g., integrated into the same semiconductor packaging). In implementations in which the interface circuit 120 and the sensing bridge are separate of one another, any of the terminals T1-T4 may include a contact pad, a pin, and/or any other suitable type of element for establishing electric contact. In implementations, in which the interface circuit 120 and the sensing bridge 110 are integrated into the same semiconductor packaging, any of the terminals T1-T4 may include an internal point of contact between the sensing bridge 110 and the interface circuit 120. Stated succinctly, the term "terminal" shall be interpreted broadly to refer to either a node in a circuit or an element, such as a contact pad, for establishing electrical contact.

In some implementations, any of the tables 180 and 280 may be implemented as one or more searchable data structures that are stored in a memory (not shown) of the control circuitry 146. Additionally or alternatively, in some implementations, any of the tables 180 and 280 may be implemented by using combinatorial logic. Such combinatorial logic may be configured to select a connection profile based on one or more of: (i) the voltage at any of terminals T1-T4, (ii) the current across the sensing bridge 110, and (iii) the common-mode voltage Vcm of the sensing bridge 110. Stated succinctly, the present disclosure is not limited to any specific method for selecting a signal processing profile or a connection profile for the sensing bridge 110 in accordance with the relationships discussed with respect to tables 180 and 280.

The processes described herein may be implemented in hardware, software, or a combination of the two. The processes described herein may be implemented in computer programs executed on programmable computers/machines that each includes a processor, a non-transitory machine-readable medium or another article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. An apparatus, comprising:
    a plurality of terminals for coupling the apparatus to a sensing bridge;
    a switching circuitry that is coupled to at least one of the plurality of terminals; and
    a processing circuitry that is configured to:
    cause the switching circuitry to couple the plurality of terminals to a voltage source, a ground source, and the processing circuitry in accordance with a first connection profile;
    detect a failure of the sensing bridge or a connection between the sensing bridge and any of the plurality of terminals;
    select a second connection profile based on a type of the failure; and
    cause the switching circuitry to couple the plurality of terminals to the voltage source, the ground source, and the processing circuitry in accordance with the second connection profile.

2. The apparatus of claim 1, wherein the failure is detected based on at least one of (i) a voltage on any of the plurality of terminals, (ii) a common voltage of the sensing bridge, or (iii) a current across the sensing bridge.

3. The apparatus of claim 1, further comprising a backup resistor, wherein causing the switching circuitry to couple the plurality of terminals to the voltage source, the ground source, and the processing circuitry in accordance with the second connection profile includes causing the switching circuitry to couple the backup resistor between any two of the plurality of terminals.

4. The apparatus of claim 1, wherein coupling the plurality of terminals to the voltage source, the ground source, and the processing circuitry in accordance with the second connection profile includes at least one of: (i) disconnecting a first one of the plurality of terminals from the voltage source and (ii) coupling a second one of the plurality of terminals to the voltage source.

5. The apparatus of claim 1, wherein coupling the plurality of terminals to the voltage source, the ground source, and the processing circuitry in accordance with the second connection profile includes at least one of: (i) disconnecting a first one of the plurality of terminals from the ground source and (ii) coupling a second one of the plurality of terminals to the ground source.

6. The apparatus of claim 1, wherein coupling the plurality of terminals to the voltage source, the ground source, and the processing circuitry in accordance with the second connection profile includes at least one of: (i) disconnecting a first one of the plurality of terminals from a compensation block that is part of the processing circuitry and (ii) coupling a second one of the plurality of terminals to the compensation block.

7. The apparatus of claim 1, wherein the processing circuitry is further configured to:
    generate an output signal in accordance with a first signal processing profile;
    select a second signal processing profile based on the type of the failure; and
    generate the output signal in accordance with the second connection profile,
    wherein generating the output signal in accordance with the first signal processing profile includes generating the output signal based on both a first signal that is generated by the sensing bridge and a second signal that is generated by the sensing bridge, and
    wherein generating the output signal in accordance with the second signal processing profile includes generating the output signal based on only one of the first signal and the second signal.

8. The apparatus of claim 1, wherein the sensing bridge includes an H-bridge configuration.

9. The apparatus of claim 1, wherein the sensing bridge comprises a plurality of strain gauges.

10. The apparatus of claim 1, wherein the sensing bridge comprises a plurality of magnetoresistance elements.

11. An apparatus, comprising:
    a plurality of terminals for coupling the apparatus to a sensing bridge; and
    a processing circuitry that is configured to:
    generate an output signal in accordance with a first signal processing profile;
    detect a failure in the sensing bridge or a connection between the sensing bridge and any of the plurality of terminals;
    select a second signal processing profile based on the type of the failure; and
    generate the output signal in accordance with the second signal processing profile,
    wherein generating the output signal in accordance with the first signal processing profile includes generating the output signal based on both a first signal that is generated by the sensing bridge and a second signal that is generated by the sensing bridge, and
    wherein generating the output signal in accordance with the second signal processing profile includes generating the output signal based on only one of the first signal and the second signal.

12. The apparatus of claim 11, wherein the failure is detected based on at least one of (i) a voltage on any of the plurality of terminals, (ii) a common voltage of the sensing bridge, or (iii) a current across the sensing bridge.

13. The apparatus of claim 11, wherein the processing circuitry is further configured to:
    cause a switching circuitry to couple the plurality of terminals to a voltage source, a ground source, and the processing circuitry in accordance with a first connection profile;
    select a second connection profile based on a type of the failure; and
    cause the switching circuitry to couple the plurality of terminals to the voltage source, the ground source, and the processing circuitry in accordance with the second connection profile.

14. The apparatus of claim 13, wherein coupling the plurality of terminals to the voltage source, the ground source, and the processing circuitry in accordance with the second connection profile includes at least one of: (i) disconnecting a first one of the plurality of terminals from the voltage source and (ii) coupling a second one of the plurality of terminals to the voltage source.

15. The apparatus of claim 13, wherein coupling the plurality of terminals to the voltage source, the ground source, and the processing circuitry in accordance with the second connection profile includes at least one of: (i) disconnecting a first one of the plurality of terminals from the ground source and (ii) coupling a second one of the plurality of terminals to the ground source.

16. The apparatus of claim 13, wherein coupling the plurality of terminals to the voltage source, the ground source, and the processing circuitry in accordance with the second connection profile includes at least one of: (i) disconnecting a first one of the plurality of terminals from a compensation block that is part of the processing circuitry and (ii) coupling a second one of the plurality of terminals to the compensation block.

17. The apparatus of claim 13, further comprising a backup resistor, wherein causing the switching circuitry to couple the plurality of terminals to the voltage source, the ground source, and the processing circuitry in accordance with the second connection profile includes causing the switching circuitry to couple the backup resistor between any two of the plurality of terminals.

18. A method for operating a sensing bridge, the method comprising:
    causing a switching circuitry to couple a plurality of terminals to a voltage source, a ground source, and a processing circuitry in accordance with a first connection profile;
    detecting a failure in the sensing bridge or a connection between the sensing bridge and any of the plurality of terminals;
    selecting a second connection profile based on a type of the failure; and
    causing the switching circuitry to couple the plurality of terminals to the voltage source, the ground source, and the processing circuitry in accordance with the second connection profile.

19. The method of claim 18, further comprising:
    generating an output signal in accordance with a first signal processing profile;
    selecting a second signal processing profile based on the type of the failure;
    generating the output signal in accordance with the second signal processing profile,
    wherein generating the output signal in accordance with the first signal processing profile includes generating the output signal based on both a first signal that is generated by the sensing bridge and a second signal that is generated by the sensing bridge, and
    wherein generating the output signal in accordance with the second signal processing profile includes generating the output signal based on only one of the first signal and the second signal.

20. The method of claim 18, wherein the failure is detected based on at least one of (i) a voltage on any of the plurality of terminals, (ii) a common voltage of the sensing bridge, or (iii) a current across the sensing bridge.

21. The method of claim 18, wherein coupling the plurality of terminals to the voltage source, the ground source, and the processing circuitry in accordance with the second connection profile includes at least one of: (i) disconnecting a first one of the plurality of terminals from the voltage source and (ii) coupling a second one of the plurality of terminals to the voltage source.

22. The method of claim 18, wherein coupling the plurality of terminals to the voltage source, the ground source, and the processing circuitry in accordance with the second connection profile includes at least one of: (i) disconnecting a first one of the plurality of terminals from the ground source and (ii) coupling a second one of the plurality of terminals to the ground source.

23. The method of claim 18, wherein coupling the plurality of terminals to the voltage source, the ground source, and the processing circuitry in accordance with the second connection profile includes at least one of: (i) disconnecting a first one of the plurality of terminals from a compensation block and (ii) coupling a second one of the plurality of terminals to the compensation block.

24. The method of claim 18, wherein causing the switching circuitry to couple the plurality of terminals to the voltage source, the ground source, and the processing circuitry in accordance with the second connection profile includes causing the switching circuitry to couple a backup resistor between any two of the plurality of terminals.

* * * * *